United States Patent
Lee

(10) Patent No.: US 10,952,324 B2
(45) Date of Patent: Mar. 16, 2021

(54) SPACER FOR SURFACE MOUNTABLE ELECTRONIC COMPONENTS

(71) Applicant: FACEBOOK TECHNOLOGIES, LLC, Menlo Park, CA (US)

(72) Inventor: Raymond Lee, Fremont, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/384,656

(22) Filed: Apr. 15, 2019

(65) Prior Publication Data
US 2020/0329561 A1 Oct. 15, 2020

(51) Int. Cl.
*H05K 1/14* (2006.01)
*G02B 27/00* (2006.01)
(Continued)

(52) U.S. Cl.
CPC ......... *H05K 1/144* (2013.01); *G02B 27/0093* (2013.01); *G02B 27/0172* (2013.01); *H01L 33/486* (2013.01); *H05K 1/116* (2013.01); *H05K 1/181* (2013.01); *G02B 2027/014* (2013.01); *G02B 2027/0112* (2013.01); *G02B 2027/0138* (2013.01); *G02B 2027/0178* (2013.01); *H05K 2201/09027* (2013.01);
(Continued)

(58) Field of Classification Search
CPC ........ H05K 1/144; H05K 1/116; H05K 1/181; H05K 2201/10128; H05K 2201/09027; H05K 2201/10378; H05K 2201/10106; H05K 2201/049; H05K 2201/10484; H05K 1/141; H05K 1/0274; H01L 33/486; G02B 27/0172; G02B 27/0093; G02B 2027/0178; G02B 2027/0138; G02B 2027/0112; G02B 2027/014
See application file for complete search history.

(56) References Cited

U.S. PATENT DOCUMENTS

| 6,332,782 | B1 | 12/2001 | Bezama et al. |
| 6,918,297 | B2 * | 7/2005 | MacGugan ........... B81B 7/0074 257/416 |

(Continued)

FOREIGN PATENT DOCUMENTS

EP 2938170 A1 10/2015

OTHER PUBLICATIONS

Facebook Technologies, LLC, International Search Report and Written Opinion, PCT/US2020/025162, dated Jun. 24, 2020, 12 pgs.

*Primary Examiner* — Yasser A Abdelaziez
(74) *Attorney, Agent, or Firm* — Morgan, Lewis & Bockius LLP

(57) ABSTRACT

A spacer is provided to allow a surface mount device (SMD) to be surface mounted onto a PCB with greater degrees of freedom. The spacer is designed to be surface mountable to the PCB and includes an electrically non-conducting body that has a first surface facing the SMD, a second surface facing the PCB, and through holes and/or indents in the electrically non-conducting body to accommodate electrical conductors that provide electrical connections between the SMD and the PCB. The spacer may provide one or more of: an elevated height (so that the SMD is elevated above the PCB), an offset along the surface of the PCB relative to a designated position for the SMD on the PCB, or a tilt in one or more directions relative to a surface of the PCB.

18 Claims, 18 Drawing Sheets

(51) Int. Cl.
*G02B 27/01* (2006.01)
*H01L 33/48* (2010.01)
*H05K 1/11* (2006.01)
*H05K 1/18* (2006.01)

(52) U.S. Cl.
CPC .............. *H05K 2201/10106* (2013.01); *H05K 2201/10128* (2013.01); *H05K 2201/10378* (2013.01); *H05K 2201/10484* (2013.01)

(56) References Cited

U.S. PATENT DOCUMENTS

| | | | |
|---|---|---|---|
| 9,829,710 B1* | 11/2017 | Newell | G02B 27/0172 |
| 2003/0003705 A1 | 1/2003 | Chung et al. | |
| 2003/0209789 A1 | 11/2003 | Hanson et al. | |
| 2008/0314624 A1* | 12/2008 | Donners | H05K 3/301 |
| | | | 174/255 |
| 2013/0147347 A1* | 6/2013 | Laporte | F21V 5/04 |
| | | | 313/512 |
| 2015/0015142 A1* | 1/2015 | Chu | F21K 9/90 |
| | | | 315/51 |

* cited by examiner

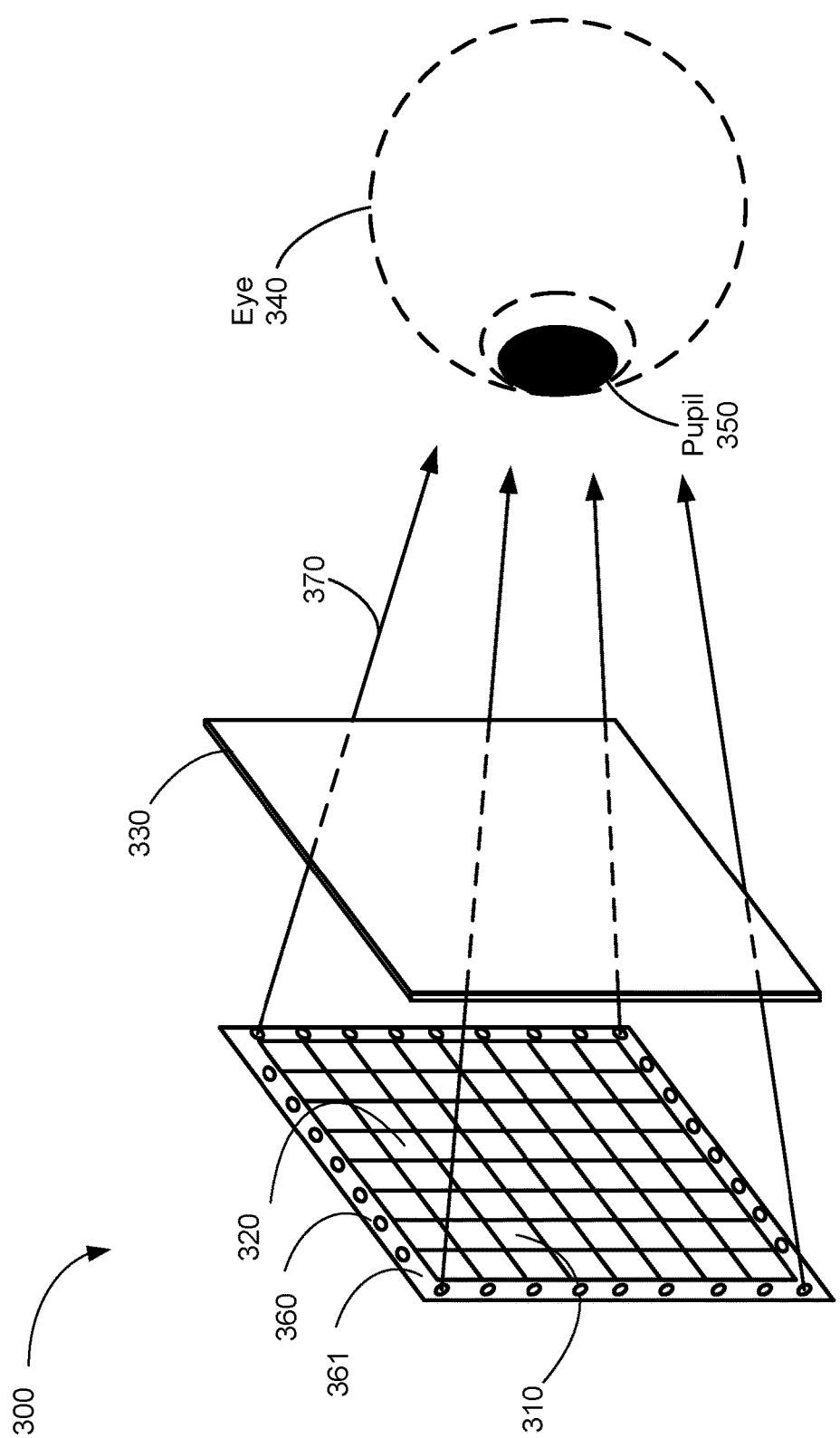

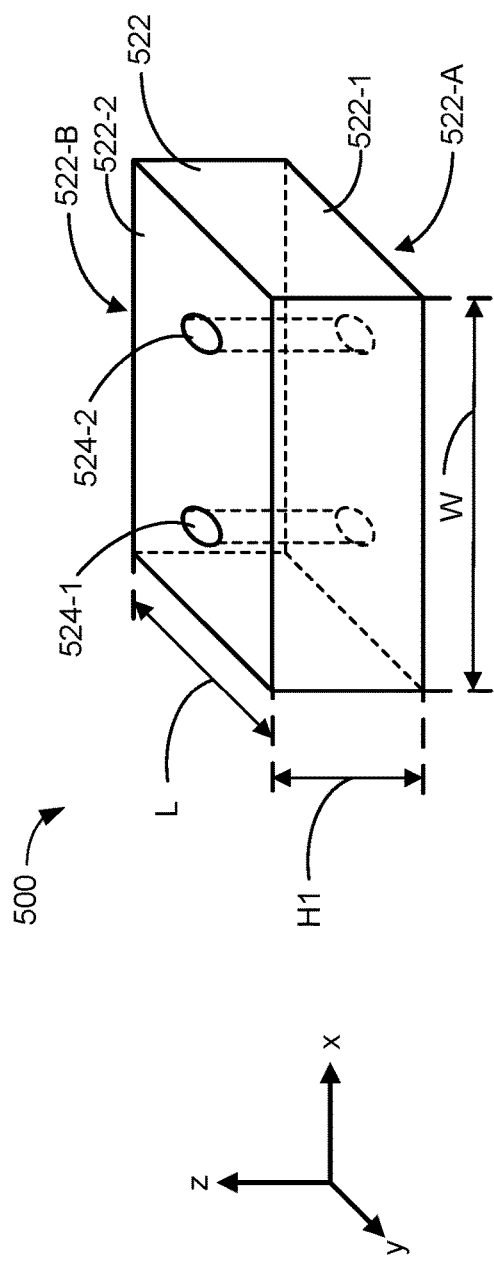
Figure 5A
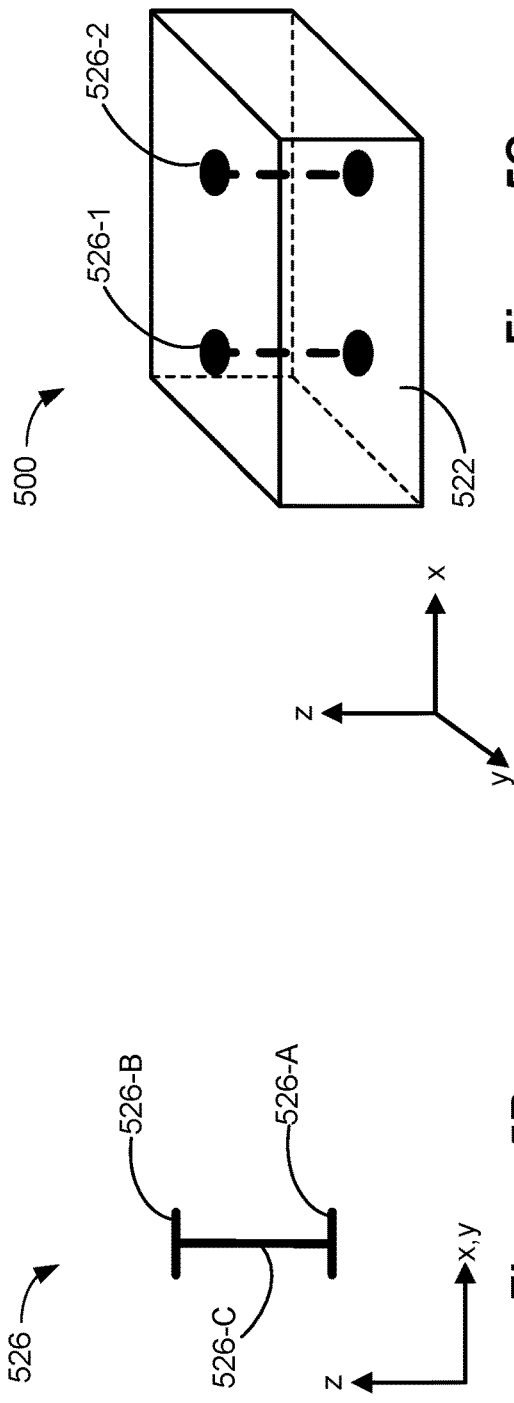
Figure 5C
Figure 5B

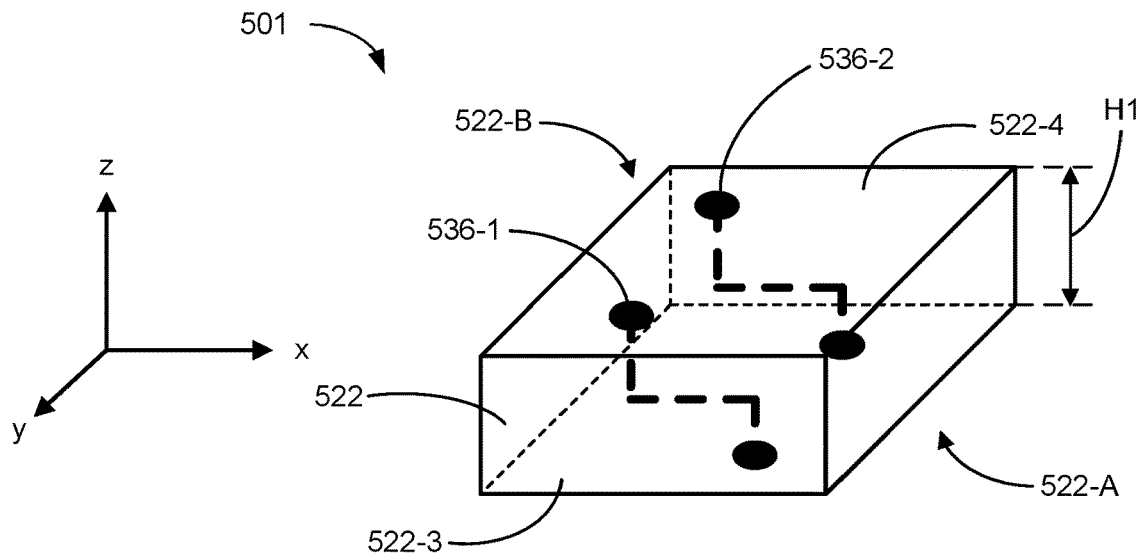
Figure 5H
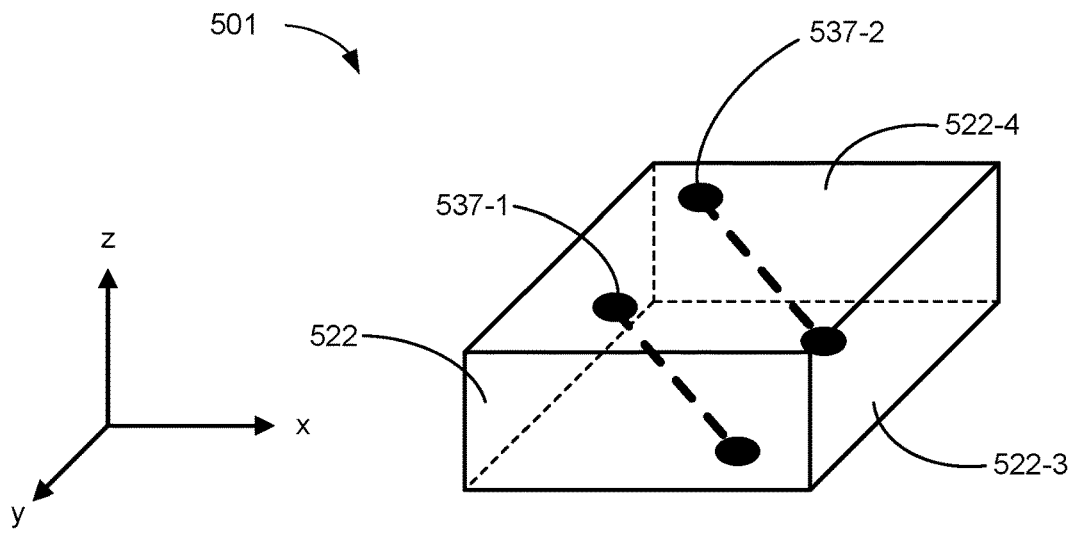
Figure 5I
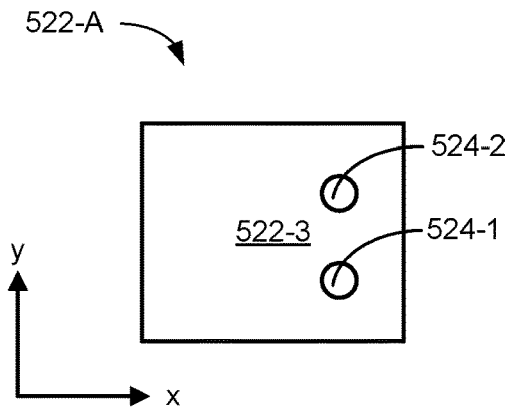 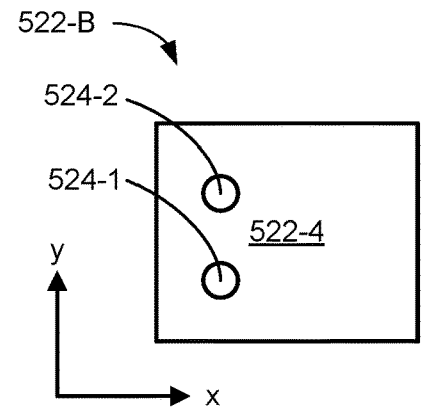
Figure 5J                Figure 5K

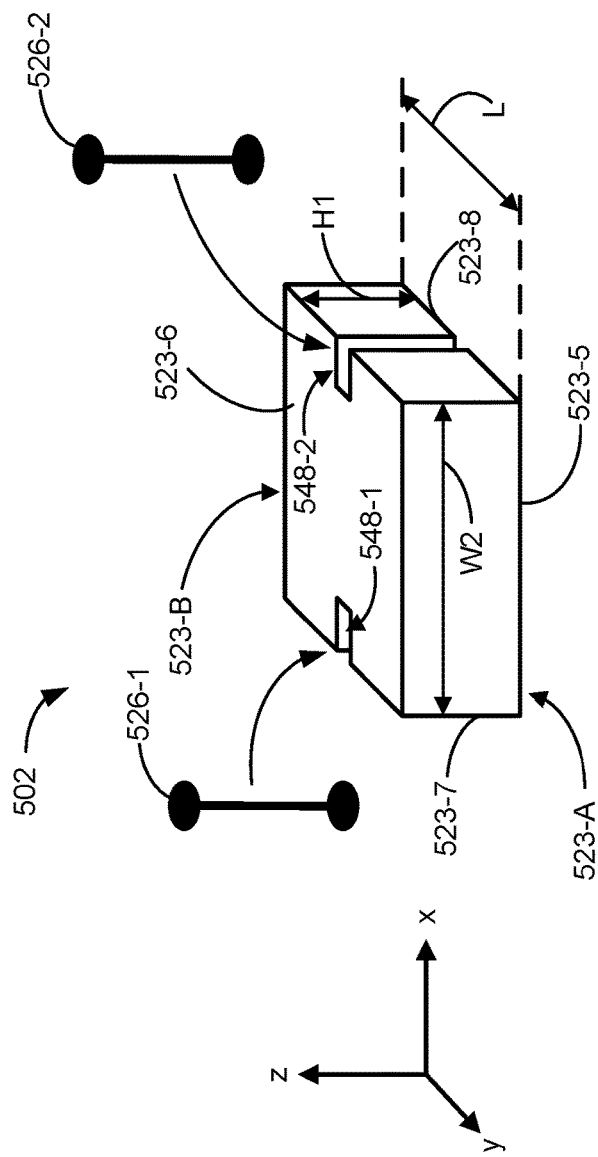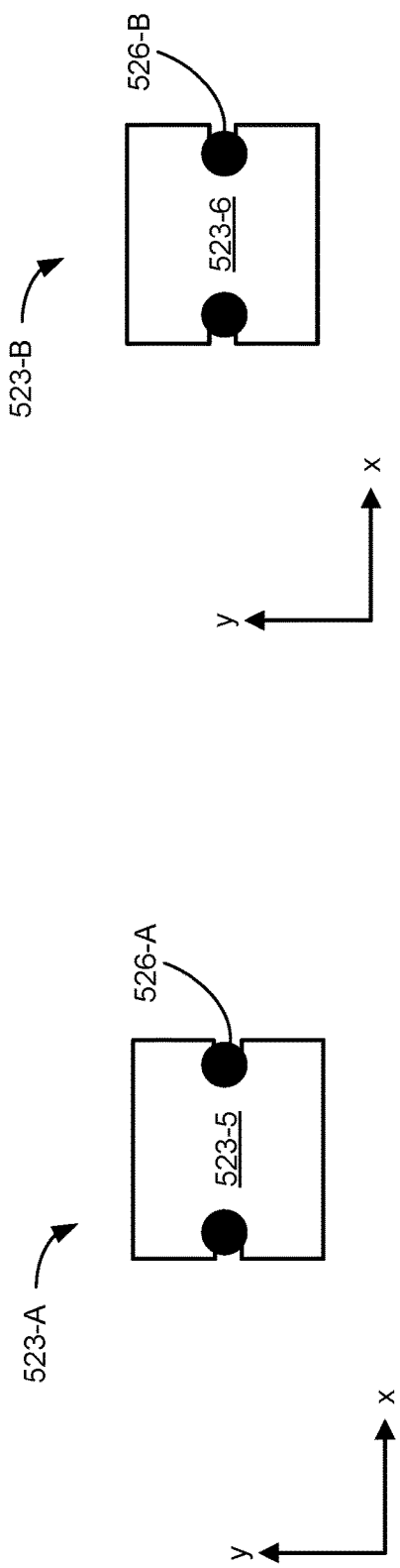
Figure 5L
Figure 5M
Figure 5N

SPACER FOR SURFACE MOUNTABLE ELECTRONIC COMPONENTS

TECHNICAL FIELD

This relates generally to electronics technology, and more specifically to surface mountable electronic components.

BACKGROUND

Surface-mount technology (SMT) is the main technology for producing electronic circuits in which electronic components are mounted or placed directly onto the surface of printed circuit boards (PCBs). Such electronic components are specifically made to be surface mountable and are often referred to as surface-mount devices (SMDs). SMDs are designed to be placed on and soldered to a surface of a PCB. For example, different electrical components (such as a transistor, resistor, light-emitting diode, or integrated circuit chip) may be mounted on a PCB to form a circuit for everyday electronic devices or equipment such as televisions, computers, appliance, etc.

SUMMARY

Although SMT provides many advantages, there are also disadvantages to the technique. For example, SMT generally requires that a surface-mount device (SMD) lies flat on a surface of a PCB. Thus, the position and orientation of the SMD are dictated by positions of corresponding contacts on the PCB as well as the shape of the PCB. In some applications, it may be desirable to customize the position and/or orientation of an SMD on a PCB. For example, if the SMD is a light-emitting component, it may be desirable to tilt the SMD toward an illumination target to provide a better power profile without having to procure a customized (and often costly) tilted or curved PCB. Accordingly, there is a need for placing SMDs on a PCB that allows for greater degrees of freedom in position and/or orientation. Surface mountable spacers are provided herein to meet such needs.

In accordance with some embodiments, a spacer that is mountable on a printed circuit board has an electrically non-conducting body and electrical conductors. The electrically non-conducting body has a first side and a second side that opposes the first side. The electrical conductors have a first member on the first side of the electrically non-conducting body, a second member on the second side of the electrically non-conducting body, and a connecting member joining the first member on the first side and the second member on the second side. The first member is configured to allow the spacer to be surface mounted on the printed circuit board. The second member is configured to allow an electrical component to be surface mounted on the second side of the electrically non-conducting body and electrically coupled to the printed circuit board via the electrical conductors.

In accordance with some embodiments, and electrical assembly includes a printed circuit board, one or more spacers that are surface mounted on the printed circuit board, and one or more electrical components. Each of the spacers include an electrically non-conducting body and electrical conductors. The electrically non-conducting body has a first side and a second side that opposes the first side. The electrical conductors have a first member on the first side of the electrically non-conducting body, a second member on the second side of the electrically non-conducting body, and a connecting member joining the first member on the first side and the second member on the second side. The first member is configured to allow the spacer to be surface mounted on the printed circuit board. The second member is configured to allow an electrical component to be surface mounted on the second side of the electrically non-conducting body and electrically coupled to the printed circuit board via the electrical conductors. Each electrical component of the one or more electrical components is surface mounted on the second side of an electrically non-conducting body of a respective spacer and is electrically coupled to the printed circuit board through electrical conductors of the respective spacer.

Thus, the disclosed embodiments provide a light source that can illuminate the user's eyes with improved power profile.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIG. 3 is an isometric view of a display device with an eye illumination source in accordance with some embodiments.

FIG. 5A illustrates a perspective view of a spacer in accordance with some embodiments.

FIG. 5B illustrates an electrical conductor in accordance with some embodiments.

FIG. 5C illustrates a perspective view of the spacer shown in FIG. 5A that includes electrical conductors in accordance with some embodiments.

FIGS. 5H and 5I a perspective view of spacers that include electrical conductors in accordance with some embodiments.

FIGS. 5J and 5K illustrate surfaces of a spacer in accordance with some embodiments.

FIG. 5L illustrates a spacer in accordance with some embodiments.

FIGS. 5M and 5N illustrate surfaces of the spacer shown in FIG. 5L.

Figure 1:
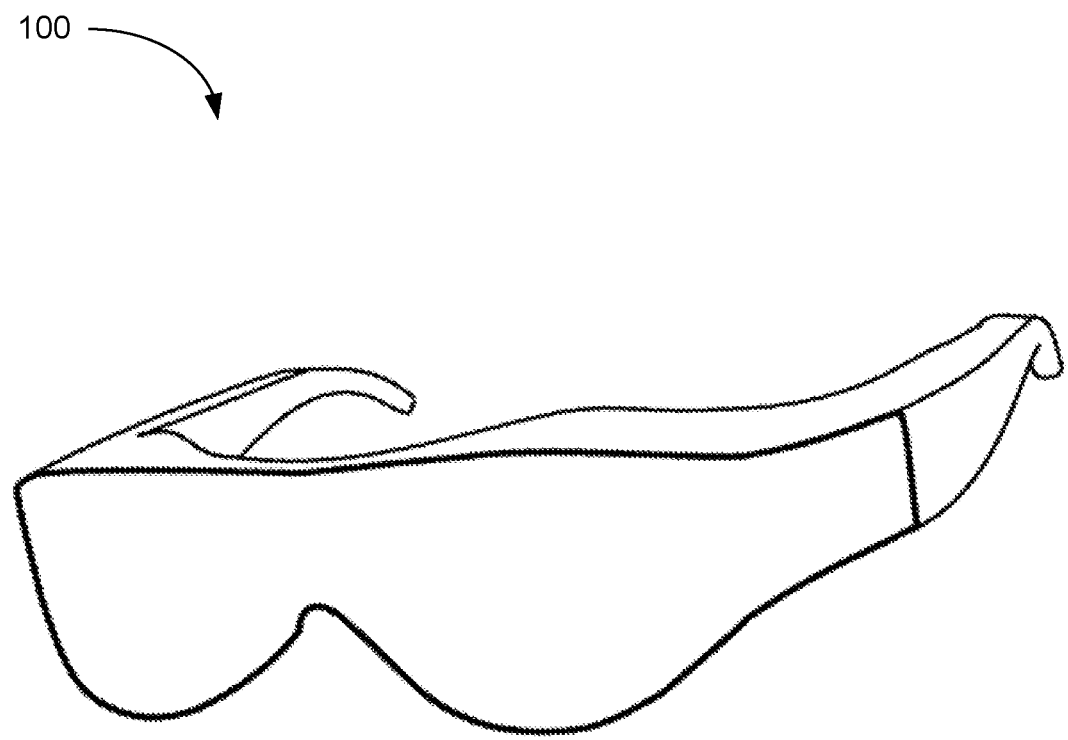
FIG. 1 is a perspective view of a display device in accordance with some embodiments.

These figures are not drawn to scale unless indicated otherwise.

DETAILED DESCRIPTION

There is a need for surface mount technologies that allow for greater customization in the placement of electrical components on a printed circuit board (PCB).

The present disclosure provides a spacer that allows a surface mount device (SMD) to be surface mounted to a PCB with greater degrees of freedom. The spacer is designed to be surface mountable and includes a non-electrically conducting body that has a first surface facing the SMD, a second surface facing the PCB, and through holes and/or indents in the electrically non-conducting body to accommodate electrical conductors that provide electrical connections between the SMD and the PCB. The spacer may provide one or more of: an elevated height (so that the SMD is elevated above the PCB), an offset along the surface of the PCB relative to a designated position for the SMD on the PCB, or a tilt in one or more directions relative to a surface of the PCB.

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first light projector could be termed a second light projector, and, similarly, a second light projector could be termed a first light projector, without departing from the scope of the various described embodiments. The first light projector and the second light projector are both light projectors, but they are not the same light projector.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind."

FIG. 1 illustrates display device 100 in accordance with some embodiments. In some embodiments, display device 100 is configured to be worn on a head of a user (e.g., by having the form of spectacles or eyeglasses, as shown in FIG. 1) or to be included as part of a helmet that is to be worn by the user. When display device 100 is configured to be worn on a head of a user or to be included as part of a helmet, display device 100 is called a head-mounted display. Alternatively, display device 100 is configured for placement in proximity of an eye or eyes of the user at a fixed location, without being head-mounted (e.g., display device 100 is mounted in a vehicle, such as a car or an airplane, for placement in front of an eye or eyes of the user). As shown in FIG. 1, display device 100 includes display 110. Display 110 is configured for presenting visual contents (e.g., augmented reality contents, virtual reality contents, mixed reality contents, or any combination thereof) to a user.

Figure 2:
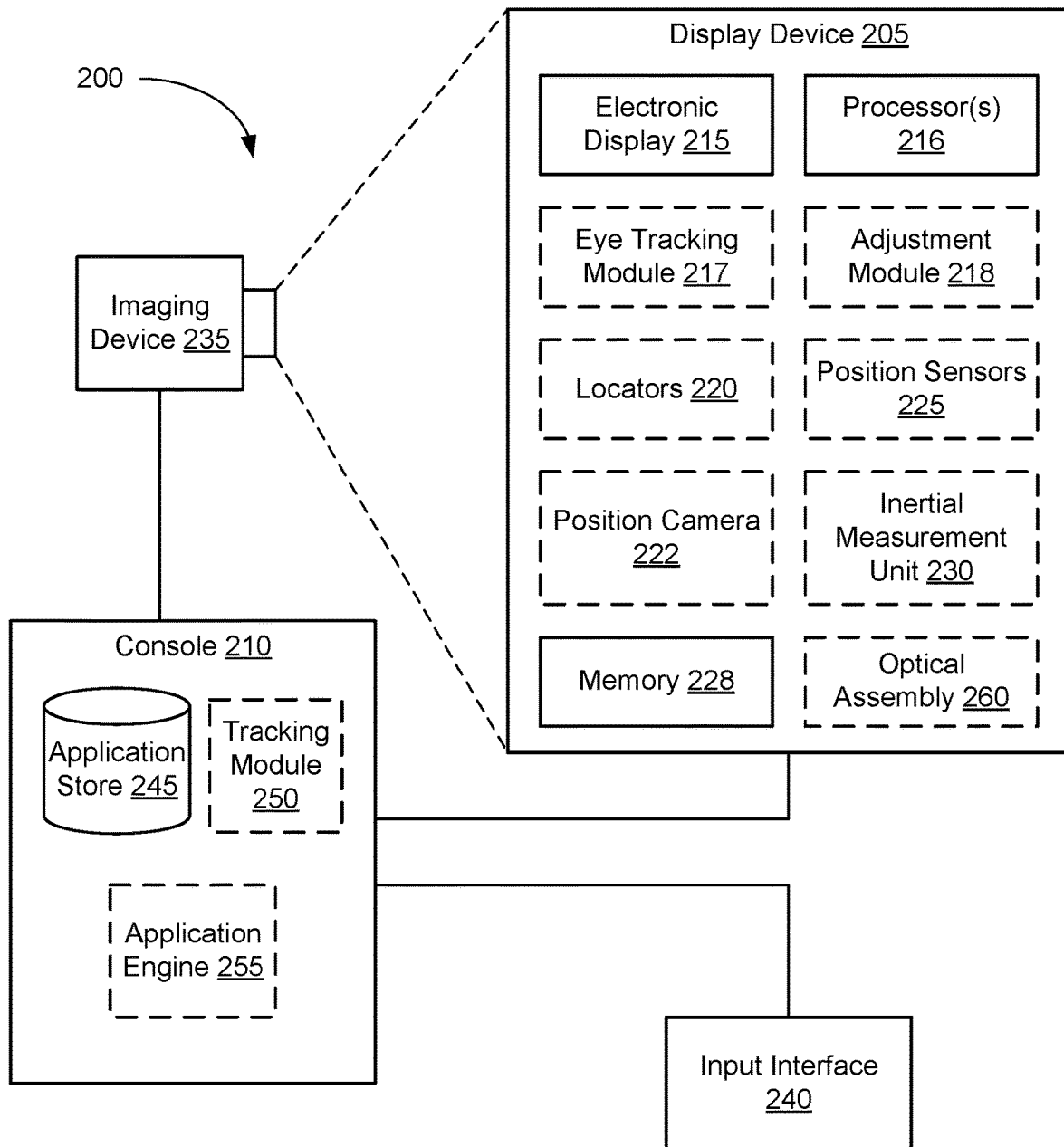
FIG. 2 is a block diagram of a system including a display device in accordance with some embodiments.

In some embodiments, display device 100 includes one or more components described herein with respect to FIG. 2. In some embodiments, display device 100 includes additional components not shown in FIG. 2.

FIG. 2 is a block diagram of system 200 in accordance with some embodiments. The system 200 shown in FIG. 2 includes display device 205 (which corresponds to display device 100 shown in FIG. 1), imaging device 235, and input interface 240 that are each coupled to console 210. While FIG. 2 shows an example of system 200 including one display device 205, imaging device 235, and input interface 240, in other embodiments, any number of these components may be included in system 200. For example, there may be multiple display devices 205 each having associated input interface 240 and being monitored by one or more imaging devices 235, with each display device 205, input interface 240, and imaging devices 235 communicating with console 210. In alternative configurations, different and/or additional components may be included in system 200. For example, in some embodiments, console 210 is connected via a network (e.g., the Internet) to system 200 or is self-contained as part of display device 205 (e.g., physically located inside display device 205). In some embodiments, display device 205 is used to create mixed reality by adding in a view of the real surroundings. Thus, display device 205 and system 200 described here can deliver augmented reality, virtual reality, and mixed reality.

In some embodiments, as shown in FIG. 1, display device 205 is a head-mounted display that presents media to a user. Examples of media presented by display device 205 include one or more images, video, audio, or some combination thereof. In some embodiments, audio is presented via an external device (e.g., speakers and/or headphones) that receives audio information from display device 205, console 210, or both, and presents audio data based on the audio information. In some embodiments, display device 205 immerses a user in an augmented environment.

In some embodiments, display device 205 also acts as an augmented reality (AR) headset. In these embodiments, display device 205 augments views of a physical, real-world environment with computer-generated elements (e.g., images, video, sound, etc.). Moreover, in some embodiments, display device 205 is able to cycle between different types of operation. Thus, display device 205 operate as a virtual reality (VR) device, an augmented reality (AR) device, as glasses or some combination thereof (e.g., glasses with no optical correction, glasses optically corrected for the user, sunglasses, or some combination thereof) based on instructions from application engine 255.

Display device 205 includes electronic display 215, one or more processors 216, eye tracking module 217, adjustment module 218, one or more locators 220, one or more position sensors 225, one or more position cameras 222, memory 228, inertial measurement unit (IMU) 230, one or more reflective elements 260 or a subset or superset thereof (e.g., display device 205 with electronic display 215, one or more processors 216, and memory 228, without any other listed components). Some embodiments of display device 205 have different modules than those described here. Similarly, the functions can be distributed among the modules in a different manner than is described here.

One or more processors 216 (e.g., processing units or cores) execute instructions stored in memory 228. Memory 228 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 228, or alternately the non-volatile memory device(s) within memory 228, includes a non-transitory computer readable storage medium. In some embodiments, memory 228 or the computer readable storage medium of memory 228 stores programs, modules and data structures, and/or instructions for displaying one or more images on electronic display 215.

Electronic display 215 displays images to the user in accordance with data received from console 210 and/or processor(s) 216. In various embodiments, electronic display 215 may comprise a single adjustable display element or multiple adjustable display elements (e.g., a display for each eye of a user). In some embodiments, electronic display 215 is configured to display images to the user by projecting the images onto one or more reflective elements 260.

In some embodiments, the display element includes one or more light emission devices and a corresponding array of spatial light modulators. A spatial light modulator is an array of electro-optic pixels, opto-electronic pixels, some other array of devices that dynamically adjust the amount of light transmitted by each device, or some combination thereof. These pixels are placed behind one or more lenses. In some embodiments, the spatial light modulator is an array of liquid crystal based pixels in an LCD (a Liquid Crystal Display). Examples of the light emission devices include: an organic light emitting diode (LED), an active-matrix organic light-emitting diode, a light emitting diode, some type of device capable of being placed in a flexible display, or some combination thereof. The light emission devices include devices that are capable of generating visible light (e.g., red, green, blue, etc.) used for image generation. The spatial light modulator is configured to selectively attenuate individual light emission devices, groups of light emission devices, or some combination thereof. Alternatively, when the light emission devices are configured to selectively attenuate individual emission devices and/or groups of light emission devices, the display element includes an array of such light emission devices without a separate emission intensity array. In some embodiments, electronic display 215 projects images to one or more reflective elements 260, which reflect at least a portion of the light toward an eye of a user.

One or more lenses direct light from the arrays of light emission devices (optionally through the emission intensity arrays) to locations within each eyebox and ultimately to the back of the user's retina(s). An eyebox is a region that is occupied by an eye of a user located proximity to display device 205 (e.g., a user wearing display device 205) for viewing images from display device 205. In some cases, the eyebox is represented as a 10 mm×10 mm square. In some embodiments, the one or more lenses include one or more coatings, such as anti-reflective coatings.

In some embodiments, the display element includes an infrared (IR) detector array that detects IR light that is retro-reflected from the retinas of a viewing user, from the surface of the corneas, lenses of the eyes, or some combination thereof. The IR detector array includes an IR sensor or a plurality of IR sensors that each correspond to a different position of a pupil of the viewing user's eye. In alternate embodiments, other eye tracking systems may also be employed.

Eye tracking module 217 determines locations of each pupil of a user's eyes. In some embodiments, eye tracking module 217 instructs electronic display 215 to illuminate the eyebox with IR light (e.g., via IR emission devices in the display element).

A portion of the emitted IR light will pass through the viewing user's pupil and be retro-reflected from the retina toward the IR detector array, which is used for determining the location of the pupil. Alternatively, the reflection off of the surfaces of the eye is used to also determine location of the pupil. The IR detector array scans for retro-reflection and identifies which IR emission devices are active when retro-reflection is detected. Eye tracking module 217 may use a tracking lookup table and the identified IR emission devices to determine the pupil locations for each eye. The tracking lookup table maps received signals on the IR detector array to locations (corresponding to pupil locations) in each eyebox. In some embodiments, the tracking lookup table is generated via a calibration procedure (e.g., user looks at various known reference points in an image and eye tracking module 217 maps the locations of the user's pupil while looking at the reference points to corresponding signals received on the IR tracking array). As mentioned above, in some embodiments, system 200 may use other eye tracking systems than the embedded IR one described herein.

Adjustment module 218 generates an image frame based on the determined locations of the pupils. In some embodiments, this sends a discrete image to the display that will tile subimages together thus a coherent stitched image will appear on the back of the retina. Adjustment module 218 adjusts an output (i.e. the generated image frame) of electronic display 215 based on the detected locations of the pupils. Adjustment module 218 instructs portions of electronic display 215 to pass image light to the determined locations of the pupils. In some embodiments, adjustment module 218 also instructs the electronic display to not pass image light to positions other than the determined locations of the pupils. Adjustment module 218 may, for example, block and/or stop light emission devices whose image light falls outside of the determined pupil locations, allow other light emission devices to emit image light that falls within the determined pupil locations, translate and/or rotate one or more display elements, dynamically adjust curvature and/or refractive power of one or more active lenses in the lens (e.g., microlens) arrays, or some combination thereof.

Optional locators 220 are objects located in specific positions on display device 205 relative to one another and relative to a specific reference point on display device 205. A locator 220 may be a light emitting diode (LED), a corner cube reflector, a reflective marker, a type of light source that contrasts with an environment in which display device 205 operates, or some combination thereof. In embodiments where locators 220 are active (i.e., an LED or other type of light emitting device), locators 220 may emit light in the visible band (e.g., about 400 nm to 750 nm), in the infrared band (e.g., about 750 nm to 1 mm), in the ultraviolet band (about 100 nm to 400 nm), some other portion of the electromagnetic spectrum, or some combination thereof.

In some embodiments, locators 220 are located beneath an outer surface of display device 205, which is transparent to the wavelengths of light emitted or reflected by locators 220 or is thin enough to not substantially attenuate the wavelengths of light emitted or reflected by locators 220. Additionally, in some embodiments, the outer surface or other portions of display device 205 are opaque in the visible band of wavelengths of light. Thus, locators 220 may emit light in the IR band under an outer surface that is transparent in the IR band but opaque in the visible band.

IMU 230 is an electronic device that generates calibration data based on measurement signals received from one or more position sensors 225. Position sensor 225 generates one or more measurement signals in response to motion of display device 205. Examples of position sensors 225 include: one or more accelerometers, one or more gyroscopes, one or more magnetometers, another suitable type of sensor that detects motion, a type of sensor used for error correction of IMU 230, or some combination thereof. Position sensors 225 may be located external to IMU 230, internal to IMU 230, or some combination thereof.

Based on the one or more measurement signals from one or more position sensors 225, IMU 230 generates first calibration data indicating an estimated position of display device 205 relative to an initial position of display device 205. For example, position sensors 225 include multiple accelerometers to measure translational motion (forward/back, up/down, left/right) and multiple gyroscopes to measure rotational motion (e.g., pitch, yaw, roll). In some embodiments, IMU 230 rapidly samples the measurement signals and calculates the estimated position of display device 205 from the sampled data. For example, IMU 230 integrates the measurement signals received from the accelerometers over time to estimate a velocity vector and integrates the velocity vector over time to determine an estimated position of a reference point on display device 205. Alternatively, IMU 230 provides the sampled measurement signals to console 210, which determines the first calibration data. The reference point is a point that may be used to describe the position of display device 205. While the reference point may generally be defined as a point in space; however, in practice the reference point is defined as a point within display device 205 (e.g., a center of IMU 230).

In some embodiments, IMU 230 receives one or more calibration parameters from console 210. As further discussed below, the one or more calibration parameters are used to maintain tracking of display device 205. Based on a received calibration parameter, IMU 230 may adjust one or more IMU parameters (e.g., sample rate). In some embodiments, certain calibration parameters cause IMU 230 to update an initial position of the reference point so it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

Imaging device 235 generates calibration data in accordance with calibration parameters received from console 210. Calibration data includes one or more images showing observed positions of locators 220 that are detectable by imaging device 235. In some embodiments, imaging device 235 includes one or more still cameras, one or more video cameras, any other device capable of capturing images including one or more locators 220, or some combination thereof. Additionally, imaging device 235 may include one or more filters (e.g., used to increase signal to noise ratio). Imaging device 235 is configured to optionally detect light emitted or reflected from locators 220 in a field of view of imaging device 235. In embodiments where locators 220 include passive elements (e.g., a retroreflector), imaging device 235 may include a light source that illuminates some or all of locators 220, which retro-reflect the light towards the light source in imaging device 235. Second calibration data is communicated from imaging device 235 to console 210, and imaging device 235 receives one or more calibration parameters from console 210 to adjust one or more imaging parameters (e.g., focal length, focus, frame rate, ISO, sensor temperature, shutter speed, aperture, etc.).

In some embodiments, display device 205 optionally includes one or more reflective elements 260. In some embodiments, electronic display device 205 optionally includes a single reflective element 260 or multiple reflective elements 260 (e.g., a reflective element 260 for each eye of a user). In some embodiments, electronic display device 215 projects computer-generated images on one or more reflective elements 260, which, in turn, reflect the images toward an eye or eyes of a user. The computer-generated images include still images, animated images, and/or a combination thereof. The computer-generated images include objects that appear to be two-dimensional and/or three-dimensional objects. In some embodiments, one or more reflective elements 260 are partially transparent (e.g., the one or more reflective elements 260 have a transmittance of at least 15%, 20%, 25%, 30%, 35%, 40%, 45%, or 50%), which allows transmission of ambient light. In such embodiments, computer-generated images projected by electronic display 215 are superimposed with the transmitted ambient light (e.g., transmitted ambient image) to provide augmented reality images.

Input interface 240 is a device that allows a user to send action requests to console 210. An action request is a request to perform a particular action. For example, an action request may be to start or end an application or to perform a particular action within the application. Input interface 240 may include one or more input devices. Example input devices include: a keyboard, a mouse, a game controller, data from brain signals, data from other parts of the human body, or any other suitable device for receiving action requests and communicating the received action requests to console 210. An action request received by input interface 240 is communicated to console 210, which performs an action corresponding to the action request. In some embodiments, input interface 240 may provide haptic feedback to the user in accordance with instructions received from console 210. For example, haptic feedback is provided when an action request is received, or console 210 communicates instructions to input interface 240 causing input interface 240 to generate haptic feedback when console 210 performs an action.

Console 210 provides media to display device 205 for presentation to the user in accordance with information received from one or more of: imaging device 235, display device 205, and input interface 240. In the example shown in FIG. 2, console 210 includes application store 245, tracking module 250, and application engine 255. Some embodiments of console 210 have different modules than those described in conjunction with FIG. 2. Similarly, the functions further described herein may be distributed among components of console 210 in a different manner than is described here.

When application store 245 is included in console 210, application store 245 stores one or more applications for execution by console 210. An application is a group of instructions, that when executed by a processor, is used for generating content for presentation to the user. Content generated by the processor based on an application may be in response to inputs received from the user via movement of display device 205 or input interface 240. Examples of applications include: gaming applications, conferencing applications, video playback application, or other suitable applications.

When tracking module 250 is included in console 210, tracking module 250 calibrates system 200 using one or more calibration parameters and may adjust one or more calibration parameters to reduce error in determination of the position of display device 205. For example, tracking module 250 adjusts the focus of imaging device 235 to obtain a more accurate position for observed locators on display device 205. Moreover, calibration performed by tracking module 250 also accounts for information received from IMU 230. Additionally, if tracking of display device 205 is lost (e.g., imaging device 235 loses line of sight of at least a threshold number of locators 220), tracking module 250 re-calibrates some or all of system 200.

In some embodiments, tracking module 250 tracks movements of display device 205 using second calibration data from imaging device 235. For example, tracking module 250 determines positions of a reference point of display device 205 using observed locators from the second calibration data and a model of display device 205. In some embodiments, tracking module 250 also determines positions of a reference point of display device 205 using position information from the first calibration data. Additionally, in some embodiments, tracking module 250 may use portions of the first calibration data, the second calibration data, or some combination thereof, to predict a future location of display device 205. Tracking module 250 provides the estimated or predicted future position of display device 205 to application engine 255.

Application engine 255 executes applications within system 200 and receives position information, acceleration information, velocity information, predicted future positions, or some combination thereof of display device 205 from tracking module 250. Based on the received information, application engine 255 determines content to provide to display device 205 for presentation to the user. For example, if the received information indicates that the user has looked to the left, application engine 255 generates content for display device 205 that mirrors the user's movement in an augmented environment. Additionally, application engine 255 performs an action within an application executing on console 210 in response to an action request received from input interface 240 and provides feedback to the user that the action was performed. The provided feedback may be visual or audible feedback via display device 205 or haptic feedback via input interface 240.

FIG. 3 is an isometric view of a display device 300 including light emission device array 310 and an optical assembly 330 of one or more lenses, in accordance with some embodiments. In some other embodiments, display device 300 is part of an electronic display (e.g., a digital microscope, a head-mounted display device, etc.).

Light emission device array 310 emits image light and optional IR light toward an eye 340 of a viewing user. Light emission device array 310 may be, e.g., an array of LEDs, an array of microLEDs, an array of OLEDs, or some combination thereof. Light emission device array 310 includes light emission devices 320 that emit light in the visible light spectrum. In some embodiments, display device 300 further includes light emitting devices 360 (e.g., LEDs, microLEDs, light-emitting SMDs) that emit eye-tracking light 370 (e.g., near-IR or IR light).

In some embodiments, display device 300 includes an emission intensity array configured to selectively attenuate light emitted from light emission array 310. In some embodiments, the emission intensity array is composed of a plurality of liquid crystal cells or pixels, groups of light emission devices, or some combination thereof. Each of the liquid crystal cells is, or in some embodiments, groups of liquid crystal cells are, addressable to have specific levels of attenuation. For example, at a given time, some of the liquid crystal cells may be set to no attenuation, while other liquid crystal cells may be set to maximum attenuation. In this manner, the emission intensity array is able to control what portion of the image light emitted from light emission device array 310 is passed to optical assembly 330. In some embodiments, display device 300 uses an emission intensity array to facilitate providing image light to a location of pupil 350 of eye 340 of a user, and minimize the amount of image light provided to other areas in the eyebox.

Optical assembly 330 is configured to receive the modified image light (e.g., attenuated light) from emission intensity array (or directly from emission device array 310), and direct the modified image light to pupil 350. In some embodiments, optical assembly 330 may also be configured to receive and transmit eye-tracking light or IR light.

Display device 300 may further include an optional IR detector array (not shown) that detects IR light retro-reflected from the retina of eye 340, a cornea of eye 340, a crystalline lens of eye 340, or some combination thereof. The IR detector array includes either a single IR sensor or a plurality of IR sensitive detectors (e.g., photodiodes). In some embodiments, the IR detector array is separate from light emission device array 310. In some embodiments, the IR detector array is integrated into light emission device array 310.

In some embodiments, light emission device array 310 and an emission intensity array make up a display element. Alternatively, the display element includes light emission device array 310 (e.g., when light emission device array 310 includes individually adjustable pixels) without the emission intensity array. In some embodiments, the display element additionally includes the IR array. In some embodiments, in response to a determined location of pupil 350, the display element adjusts the emitted image light such that the light output by the display element is refracted by optical assembly 330 toward the determined location of pupil 350, and not toward other locations in the eyebox.

In some embodiments, display device 300 includes one or more broadband sources (e.g., one or more white LEDs) coupled with a plurality of color filters, in addition to, or instead of, light emission device array 310.

In some embodiments, light emitting devices 360 are mounted on one or more PCBs disposed around light emission device array 310 (as shown) or around optical assembly 330 (not shown).

Figure 4A:
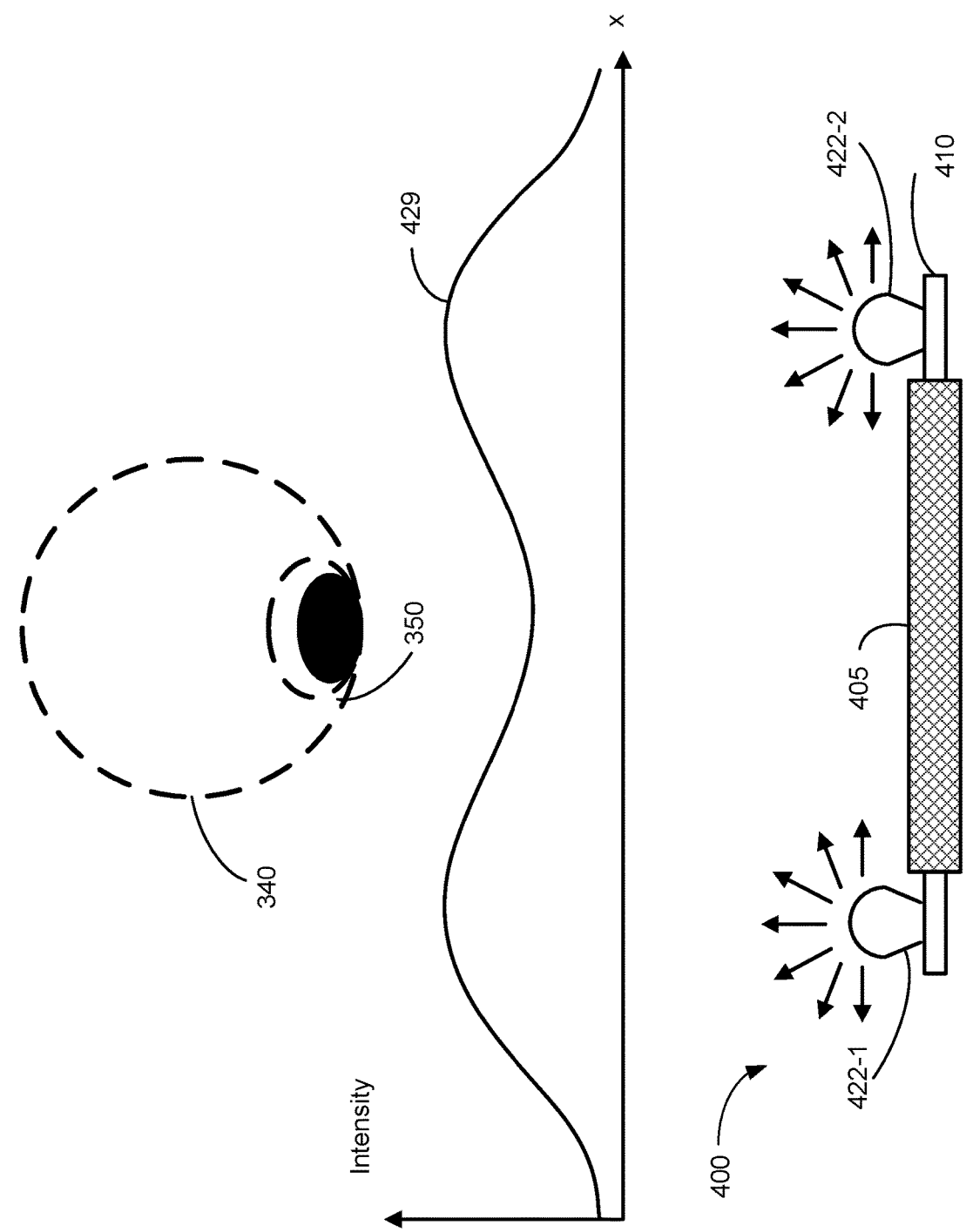
FIG. 4A illustrates a power profile of a conventional eye illumination source.

FIG. 4A illustrates a conventional eye illumination source 400 and its corresponding power profile 429. Eye illumination source 400 includes SMDs 422 (e.g., SMDs 422-1, 422-2) that are surface mounted onto one or more PCBs 410. The one or more PCBs 410 are configured to accommodate an object 405. For example, the one or more PCBs 410 may include a ring-shaped PCB that partially surrounds object 405. As a result, SMDs 422 that are surface mounted on PCB 410 are spaced apart in order to accommodate object 405. As shown, when SMDs 422 are light emitting devices (such as an LED), the power profile 429 of eye illumination source 400 dips at the target (e.g., eye 340) and peaks around the target, indicating uneven illumination of the target and poor utilization of the emitted power.

Figure 4B:
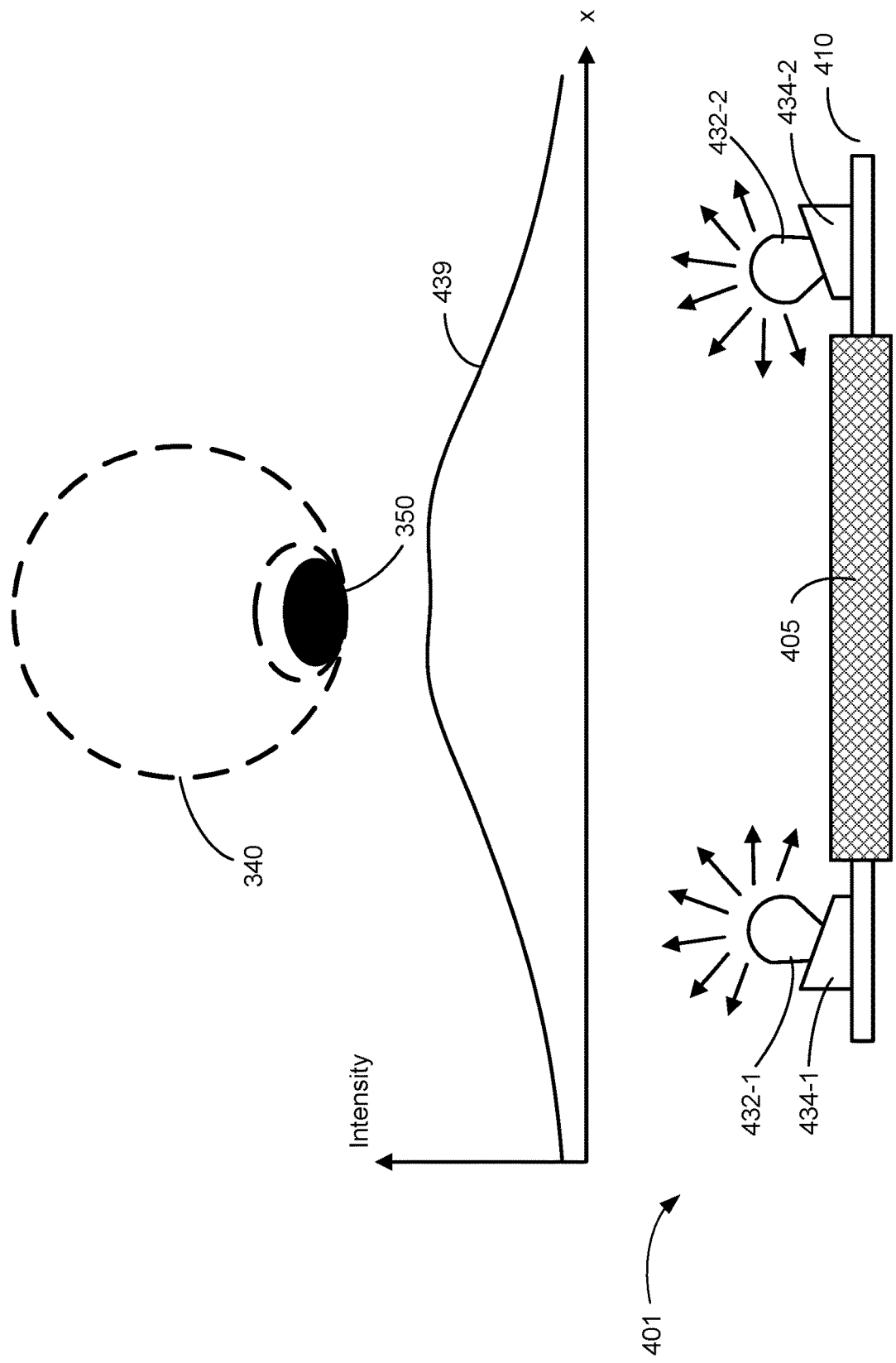
FIG. 4B illustrates a power profile of an eye illumination source in accordance with some embodiments.

FIG. 4B illustrates an eye illumination source 401 in accordance with some embodiments. Eye illumination source 401 includes SMDs 432 (e.g., SMDs 432-1 and 432-2, individually or collectively referred to hereafter as 432) and spacers 434 (e.g., 434-1 and 434-2, individually or collectively referred to hereafter as 434) that are mountable on a PCB 410. As shown, SMDs 432 are mounted on and electrically coupled to respective spacers 434. The respective spacers 434 are each mounted on and electrically coupled to a surface of PCB 410, providing electrical connections between respective SMDs 432 and PCB 410. The spacers 434 are designed to allow SMDs 432 to be tilted with respect to a surface of PCB 410. In some embodiments, as shown, SMDs 432 are surface-mounted onto spacers 434, which are in turn surface mounted onto PCB 410.

As discussed above, spacers 434 allow SMDs 432 to be spaced apart from and/or tilted with respect to a surface of a PCB. For example, in an eye-illumination application, SMDs 432 may be light-emitting devices configured to illuminate an eye 340. Due to the tilt of SMDs 432 provided by spacers 434, eye illumination source 401 has a power profile 439, showing a more even illumination compared to the power profile 429 of eye illumination source 400, shown in FIG. 4A. The tilt of light emitting SMDs 432 relative to a surface of PCB 410 also allows more light to be directed toward the eye, thereby increasing the power efficiency of eye illumination source 401.

Figure 4C:
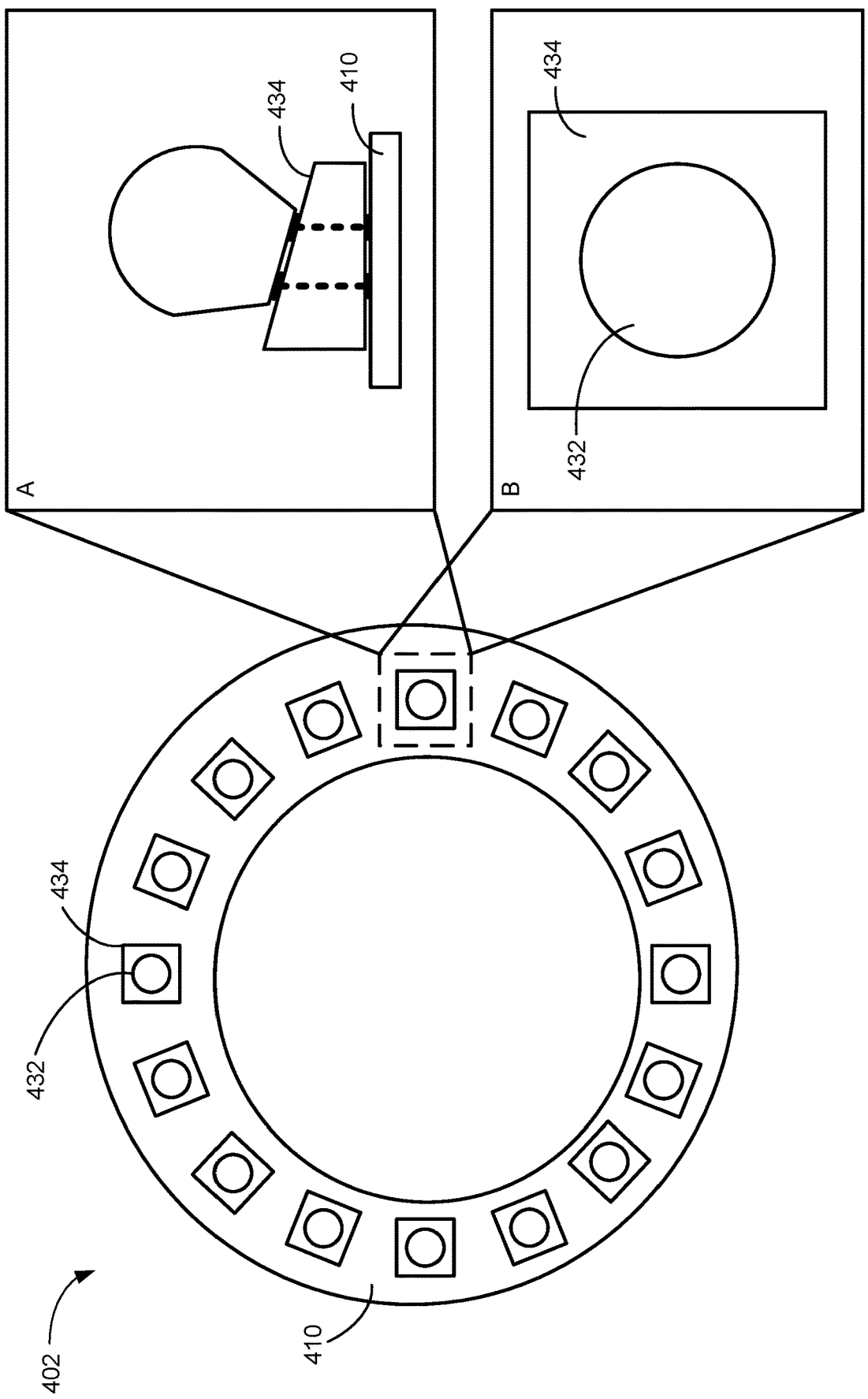
FIG. 4C illustrates an eye illumination source in accordance with some embodiments.

FIG. 4C illustrates eye illumination source 402 in accordance with some embodiments. Eye illumination source 402 includes one or more SMDs 432 surface mounted to PCB 410 via respective spacers 434. In some embodiments, PCB 410 may have a customizable shape. Further, PCB 410 may include cut-outs, as shown, allowing for further customization, adaptation, and accommodation for other devices and components. For example, PCB 410, shown in FIG. 4C can be a circular PCB with a circular cut out in the middle (e.g., donut shaped). In some applications, such as an eye-illumination application, PCB 410 may be an eye-illumination assembly where SMDs 432 (forming a circle) are light-emitting SMDs that are surface mounted on respective spacers 434, which are in turn surface mounted on PCB 410. Additionally, another component, such as a display device or an optical assembly may be included in the middle of eye-illumination assembly 402 where the cut out is. Although FIG. 4A illustrates eye-illumination assembly 402 having 16 SMDs 432 and 16 spacers 434, eye-illumination assembly 402 may include any number of SMDs 432 and spacers 434.

FIG. 4C also shows insets A and B, which illustrate a side view and a top view, respectively, of an SMD 432 surfaced mounted to PCB 410 via spacer 434. As shown, spacer 434 includes an electrically non-conducting body and electrical conductors, described in detail below. SMD 432 is surface mounted on an electrically non-conducting body of spacer 434 and is electrically coupled to PCB 410 via the electrical conductors of spacer 434.

Figure 4D:
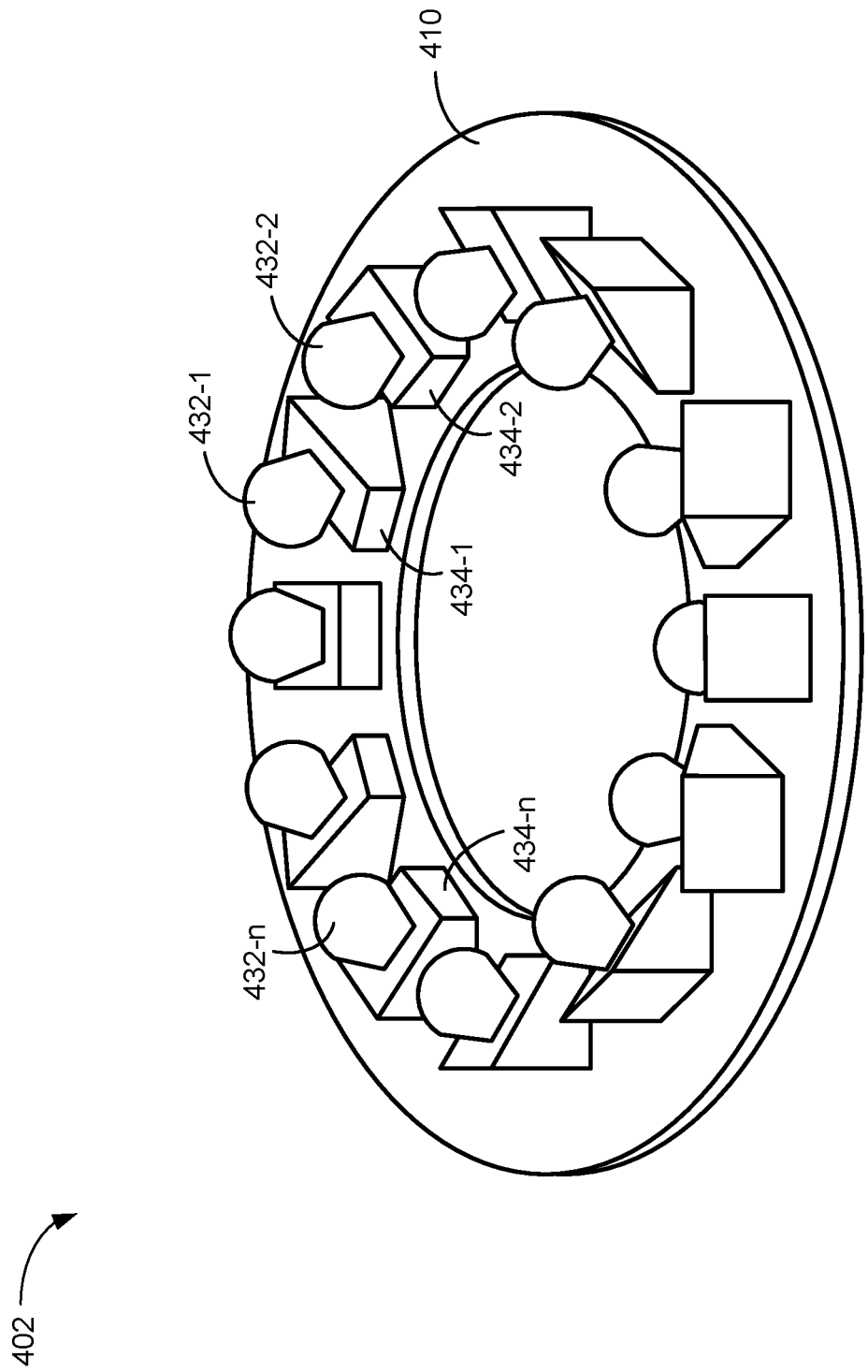
FIG. 4D illustrates a perspective view of an eye illumination source in accordance with some embodiments.

FIG. 4D illustrates a perspective view of eye-illumination assembly 402 in accordance with some embodiments. In some embodiments, as shown, eye-illumination assembly 402 includes a plurality of spacers 434-n arranged around a circle. In some embodiments, a surface of a respective electrically non-conducting body of each of the plurality of spacers is slanted toward a center of PCB 410 with respect to a surface of PCB 410 such that each SMD 432-n is surface mounted at a tilted orientation with respect to a surface of PCB 410.

SMDs 432-n may include electrical components of different types (e.g., an LED, a capacitor, a resistor) and each spacer of the plurality of spacers 434-n may have a different height or tilted orientation from another spacer such that an SMD is tilted at a different angle or has an orientation that is different from another SMD. For example, eye-illumination assembly 402 may include a first SMD 432-1 that is a blue LED tilted at a first angle $\alpha 1$, a second SMD 432-2 that is green LED tilted at a second angle $\alpha 2$ distinct from the first angle. Eye-illumination assembly 402 may include other SMDs as well. For example, eye-illumination assembly 402 may also include one or more red LEDs that each have an orientation and/or tilt that is distinct from the blue LED and the green LED, and a resistor that is not tilted with respect to a surface of PCB 410.

FIG. 5A illustrates a spacer 500 in accordance with some embodiments. As shown in FIG. 5A, spacer 500 includes an electrically non-conducting body 522 having a first side 522-A and an opposing second side 522-B. Electrically non-conducting body 522 has a first surface 522-1 on the first side 522-A and a second surface 522-2 on the second side 522-B. Spacer 500 also includes electrical conductors 526 shown in FIG. 5B. Electrical conductor 526 has a first member 526-A, a second member 526-B, and connecting member 526-C joining the first member 526-A and the second member 526-B.

In some embodiments, electrically non-conducting body 522 has one or more through holes 524-1 and 524-2 (individually or collectively referred to hereafter as 524) between the first surface 522-1 and the second surface 522-2. Reach respective electrical conductor 526 has its connecting member disposed in a respective through hole, allowing the electrical conductor 526 to extend from the first side 522-A of non-conducting body 522 to the second side 522-B of non-conducting body 522. For example, as shown in FIG. 5C, a first electrical conductor 526-1 has its connecting member disposed in a first through hole 524-1 and a second electrical conductor 526-2 has its connecting member disposed in a second through hole 524-2. The first member 526-A of an electrical conductor 526 is located on the first surface 522-1 of electrically non-conducting body 522 and the second member 526-B of the electrical conductor 526 is located on the second surface 522-2 of electrically non-conducting body 522. A connecting member 526-C of the electrical conductor 526 joins the first member 526-A and the second member 526-B, providing an electrical connection between the first side 522-A and the second side 522-B of electrically non-conducting body 522. The first member 522-A is configured to allow spacer 500 to be surface mounted on a surface of a PCB (e.g., PCB 410). The second member 522-B is configured to allow an SMD (e.g., an electrical component, SMD 432) to be surface mounted on the second surface 522-2 of the electrically non-conducting body 522 and be and electrically coupled to the PCB via each of the electrical conductors 526-1 and 526-2. Although only two electrical conductors 526 and two respective through holes 524 are shown, a spacer may include nay number of electrical conductors and through holes.

In some embodiments, electrical non-conducting body 522 has a roughly rectangular shape with a length L along the y-direction, a first height H1 along the z-direction, and a first width W1 along the x-direction. Electrical non-conducting body 522 can be configured to provide an elevation in the z-direction and/or an offset along the x-y plane for an SMD with respect to a mounting position on a PCB. In some embodiments, as shown in FIG. 5A, second surface 522-2 of electrically non-conducting body 522 is substantially parallel (e.g., forms an angle less than 1 degree) to first surface 522-1 of electrically non-conducting body 522.

Figure 5D:
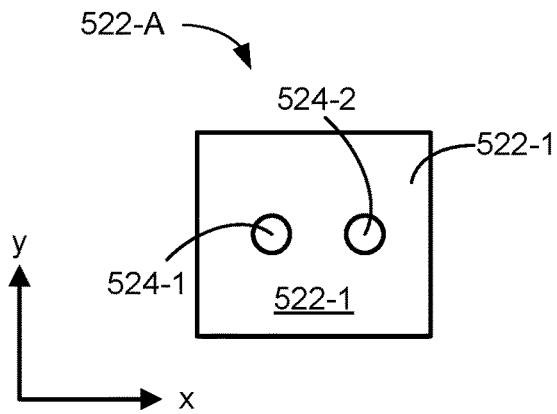
FIGS. 5D and 5E illustrate surfaces of the spacer shown in FIGS. 5A and 5B.
Figure 5E:
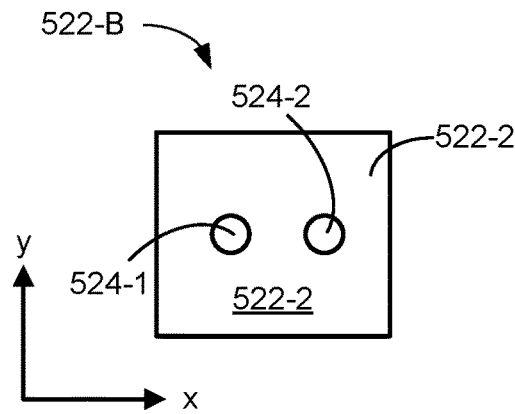

FIG. 5D illustrates a top view of electrically non-conducting body 522 of spacer 500, showing first surface 522-1 located on first side 522-A of electrically non-conducting body 522. FIG. 5E illustrates a bottom view of electrically non-conducting body 522 of spacer 500, showing second surface 522-2 located on second side 522-B of electrically non-conducting body 522. As shown, the locations of respective through holes 524 on first surface 522-1 and second surface 522-2 coincide with one another. In such cases, spacer 500 is configured to provide an offset along the z-direction without providing an offset in the x or y directions with respect to a mounting position on a PCB. In such cases, respective electrical conductors of spacer 500 have respective connecting members 526-C that extends from first surface 522-1 to second surface 522-2 of electrically non-conducting body 522 in a direction that is substantially perpendicular (e.g., forms an angle between 85 degrees and 95 degrees) to first surface 522-1, shown in FIG. 5C.

Figure 5F:
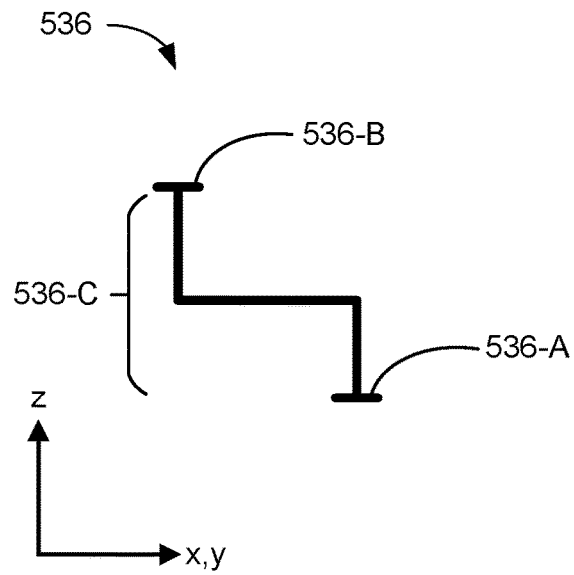
FIGS. 5F and 5G illustrate electrical conductors in the spacers in accordance with some embodiments.
Figure 5G:
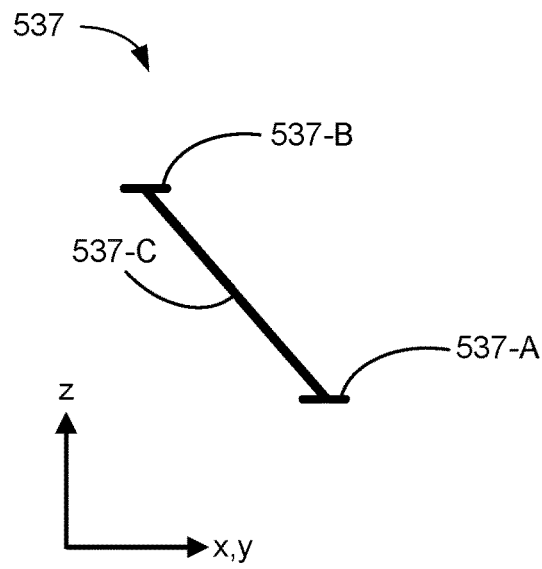

In some embodiments, a spacer is configured to provide an offset in one or more of the x and y directions with respect to a mounting position on a PCB. FIGS. 5F and 5G show two examples of electrical conductors that can be used in a spacer that provides an offset in the x-direction and/or the y-direction.

FIG. 5F illustrates an electrical conductor 536 that has a first member 536-A, a second member 536-B, and a connecting member 536-C, corresponding to first member 56-A, second member 526-B, and connecting member 526-C of electrical conductor 526, respectively. As shown in FIG. 5F, at least a portion of connecting member 536-C of electrical conductor 536 extends in a direction that is substantially parallel (e.g., forms an angle less than 1 degree) to a surface of an electrically non-conducting body. In other words, connecting member 536-C includes at least one bend.

FIG. 5G illustrates electrical conductor 537 that has a first member 537-A, a second member 537-B, and a connecting member 537-C corresponding to respective first member, second member, and connecting member of electrical conductors 526 and 536. As shown, connecting member 537-C of electrical conductor 537 extends in a direction that forms an angle that is non-perpendicular and/or non-parallel (e.g., between 0 degrees and 90 degrees) with respect to a surface of an electrically non-conducting body.

FIGS. 5H and 5I illustrate spacer 501 in accordance with some embodiments. Spacer 501 is configured to provide a lateral offset (e.g., in the x-direction and/or the y-direction) with respect to a mounting position on a PCB. Spacer 501, similar to spacer 500, includes an electrically non-conducting body 522. In contrast to spacer 500, which provides a z-offset without providing a lateral offset, electrically non-conducting body 522 of spacer 501 includes a third surface 522-3, shown in FIG. 5J, (in place of first surface 522-1) located the first side 522-A of electrically non-conducting body 522, and a fourth surface 522-4, shown in FIG. 5K, (in place of second surface 522-2) located on the second side 522-B of electrically non-conducting body 522. FIGS. 5H and 5I show spacer 501 with electrical conductors 536 and electrical conductors 537, respectively. Although spacer 501 is shown in FIGS. 5H and 5I to provide an offset along the x-direction, spacer 501 can also be configured to provide an offset along the y-direction or an offset along both the x and y directions.

In some embodiments, spacer 501 is also configured to provide an offset along the z-direction (e.g., first height H1 of electrically non-conducting body 522 is greater than zero) in addition to an offset in one or more of the x-direction and the y-direction, as described.

FIG. 5L illustrates spacer 502 in accordance with some embodiments. Spacer 502 includes electrically non-conducting body 523. Electrically non-conducting body includes similar features to electrically non-conducting body 522, described above with respect to FIG. 5A, except that electrically non-conducting body 523 includes indents 548 (e.g., indent 548-1 and indent 548-2), instead of through holes 524, to accommodate electrical conductors 526, 536, or 537. Additionally, in some embodiments (described in FIGS. 5S and 5T), electrically non-conducting body 523 may have a second width W2 that is different from first width W1 of electrically non-conducting body 522. Details regarding electrically non-conducting bodies 522 and 523 are not repeated here for brevity. Electrically non-conducting body 523 includes sidewalls 523-7 and 523-8. Each respective sidewall 523-7 and 523-8 includes a respective indent 548-1 and 548-2 (individually or collectively referred to hereafter as 548) that extends from a fifth surface 523-5 (shown in FIG. 5M) on a first side 523-A of electrically non-conducting body 523 to a sixth surface 523-6 (shown in FIG. 5N) on second side 523-B of electrically non-conducting body 523. As shown, a respective electrical conductor 526 is configured to have its connecting member disposed in a respective indent 548, allowing electrical conductor 526 to extend from the first side 522-A to the second side 522-B of electrically non-conducting body 522.

As shown in FIGS. 5A and 5L, through holes 524 and indents 548 can both be used to accommodate electrical conductors. Thus, for the different embodiments described herein, an electrically non-conducting body may interchangeably include through holes 524 or indents 548.

FIG. 5M illustrates a top view of spacer 502, showing fifth surface 523-5 located on the first side 523-A of electrically non-conducting body 523 of spacer 502. FIG. 5N illustrates a bottom view of spacer 502, showing sixth surface 523-6 located on the second side 523-B of electrically non-conducting body 523 of spacer 502. The locations of respective indents 548-1 and 548-2 on fifth surface 523-5 and sixth surface 523-6 coincide with one another. In such cases, spacer 502 is configured to provide an offset along the z-direction without providing an offset along the x or y directions with respect to a mounting position on a PCB.

Figure 5R:
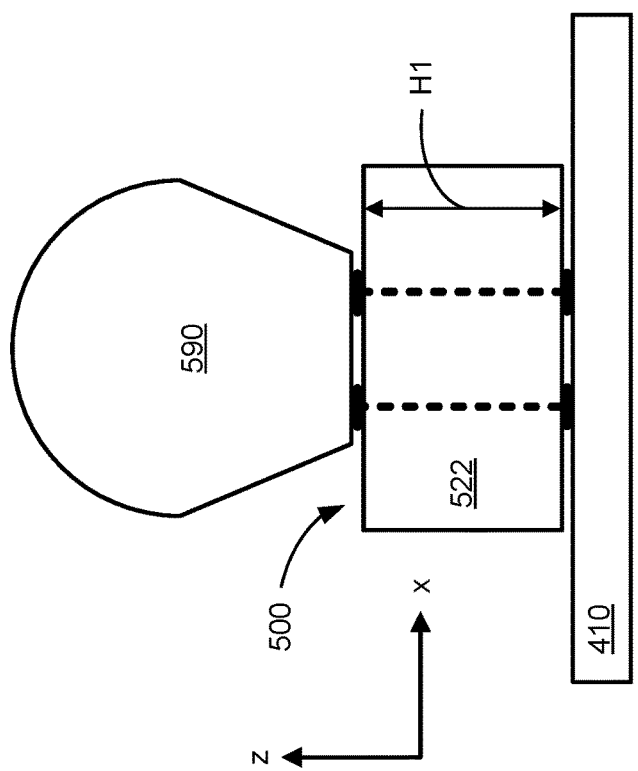
FIGS. 5Q-5X illustrate side views of illumination elements in accordance with some embodiments.
Figure 5Q:
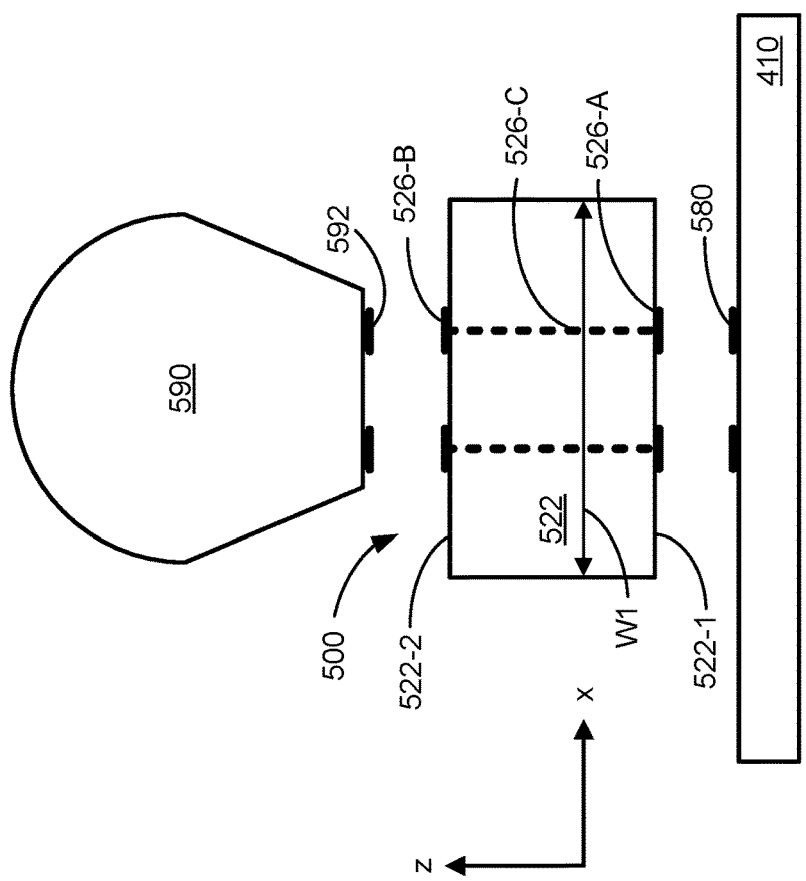

FIGS. 5Q and 5R illustrate SMD 590 when surface mounted to spacer 500 that is in turn surface mounted to PCB 410 in accordance with some embodiments. PCB 410 includes one or more contact pads 580 and SMD 590 includes one or more electrical contacts 592. SMD 590 is surface mounted on second surface 522-2 of electrically non-conducting body 522 of spacer 500. Spacer 500 is configured to be surface mounted onto a surface of PCB 410 such that the first surface 522-1 of electrically non-conducting body 522 faces the surface of PCB 410. Electrical conductors 526 of spacer 500 are electrically coupled to contact pads 580 of PCB 410 via first member 526-A (e.g., via surface mount technology, soldering). SMD 590 is configured to be surface mounted onto the second surface 522-2 of electrically non-conducting body 522. Electrical conductors 526 of spacer 500 are electrically coupled to electrical contacts 592 of SMD 590 via second member 526-B (e.g., via surface mount technology, soldering). Thus, SMD 590 is electrically coupled to PCB 410 and spaced apart from the surface of PCB 410 (by a distance that is larger than or equal to first height H1 in the z-direction via spacer 500, as shown in FIG. 5R.

Figure 5T:
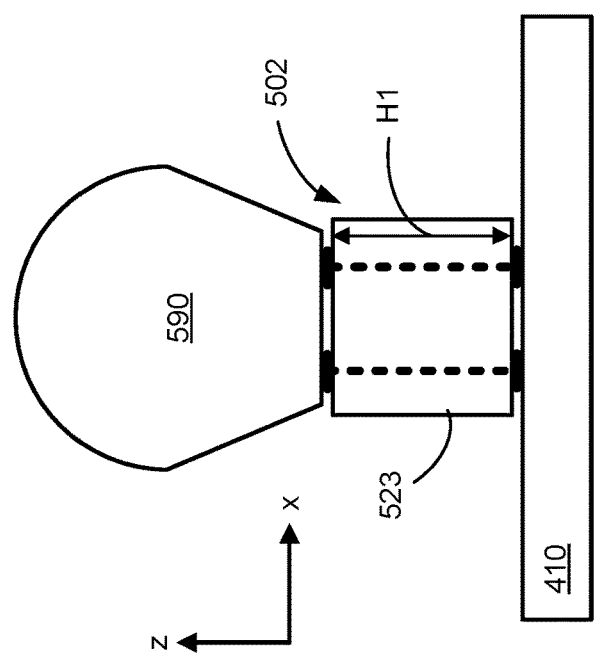
Figure 5S:
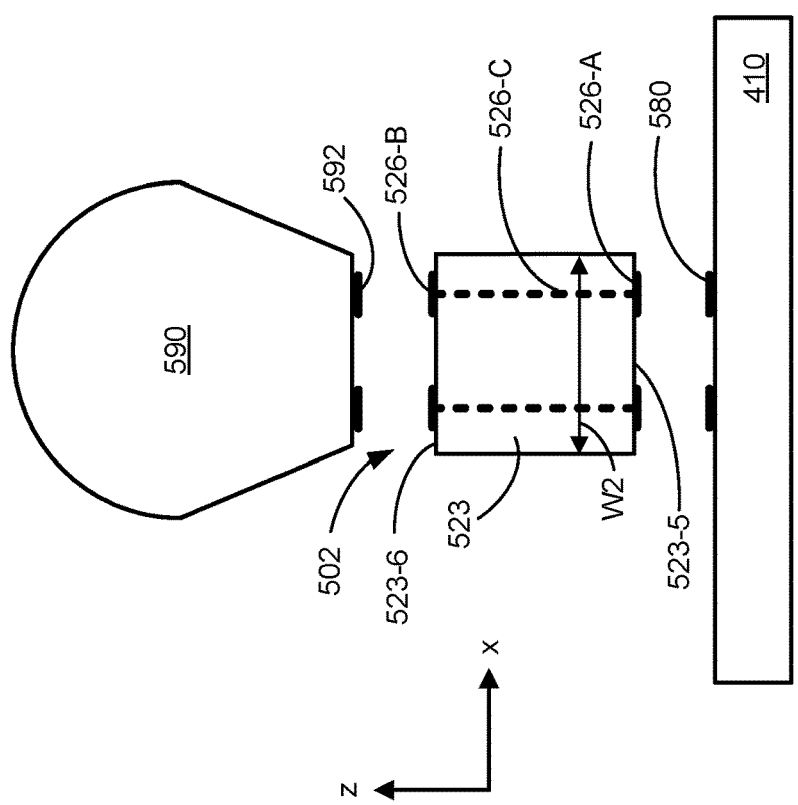

FIGS. 5S and 5T illustrate spacer 502 when surface mounted to PCB 410 and SMD 590 in accordance with some embodiments. SMD 590 is electrically coupled to and spaced apart from a surface of PCB 410 in the z-direction via spacer 502 in a similar manner as described above with respect to spacer 500 in FIGS. 5Q and 5R. However, since electrically non-conducting body 522 of spacer 502 includes indents 548 instead of through holes 524, the size and shape of spacer 502 is able to be more compact compared to spacer 500. For example, for a same height (e.g., first height H1) to provide a same z-offset, second width W2 may be smaller than first width W1.

Figure 5V:
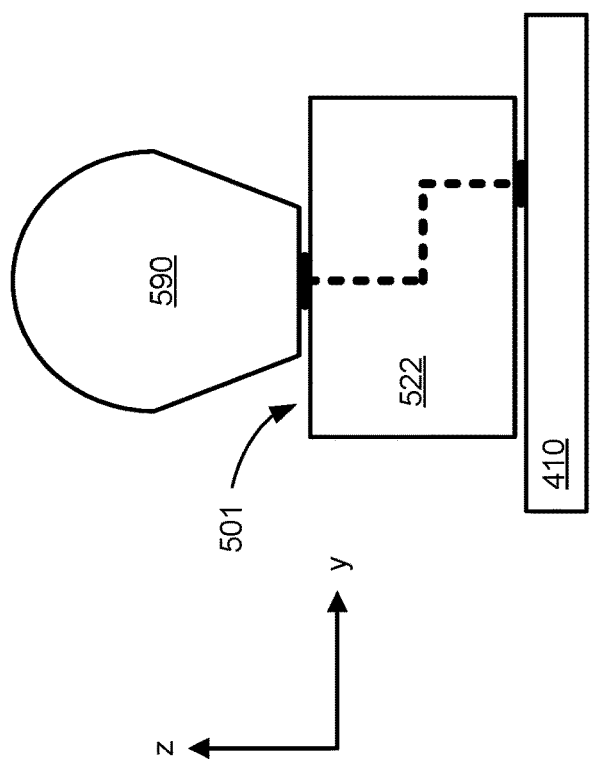
Figure 5U:
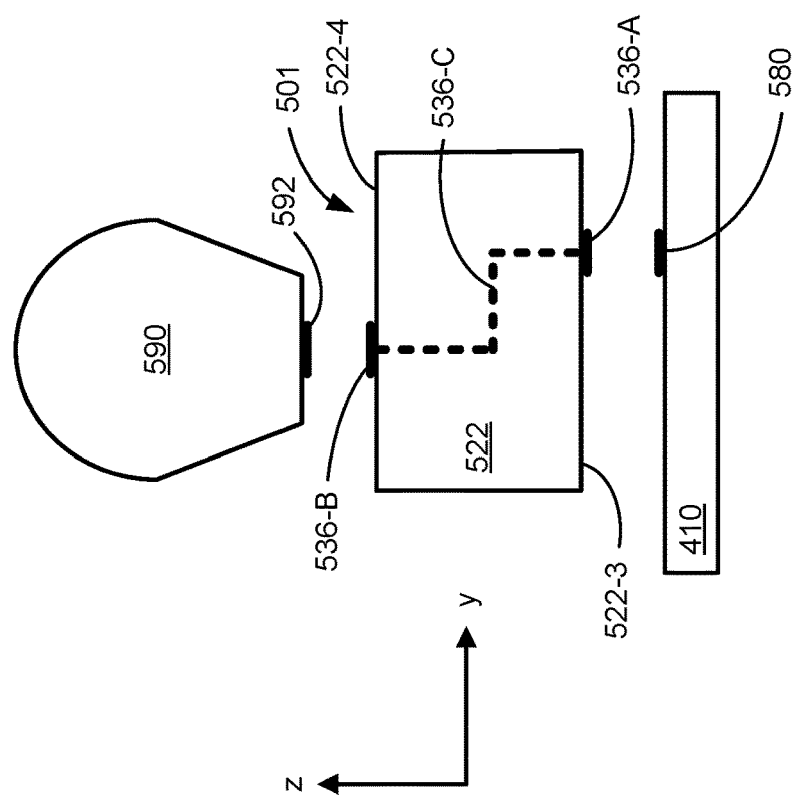

FIGS. 5U and 5V illustrate spacer 501 when surface mounted to PCB 410 and SMD 590 in accordance with some embodiments. SMD 590 is electrically coupled to and spaced apart from a surface of PCB 410 in the z-direction via spacer 501 in a similar manner as described above with respect to spacer 500 in FIGS. 5Q and 5R. In addition to an offset in the z-direction, spacer 501 also provides a lateral offset (e.g., along one or more of the x and y directions) with respect to a mounting position on a PCB 410. Although spacer 501 is shown in FIGS. 5U and 5V with electrical conductors 536, spacer 501 can also be implemented as described using electrical conductors 537.

Figure 5X:
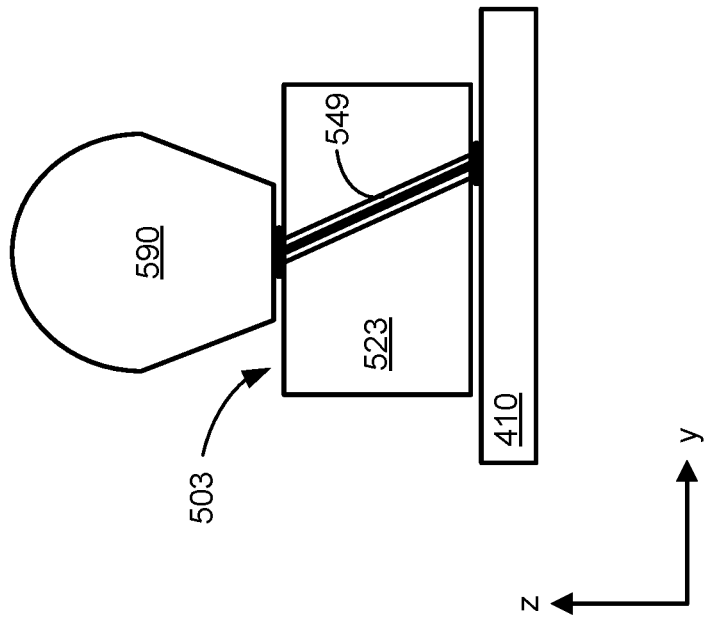
Figure 5W:
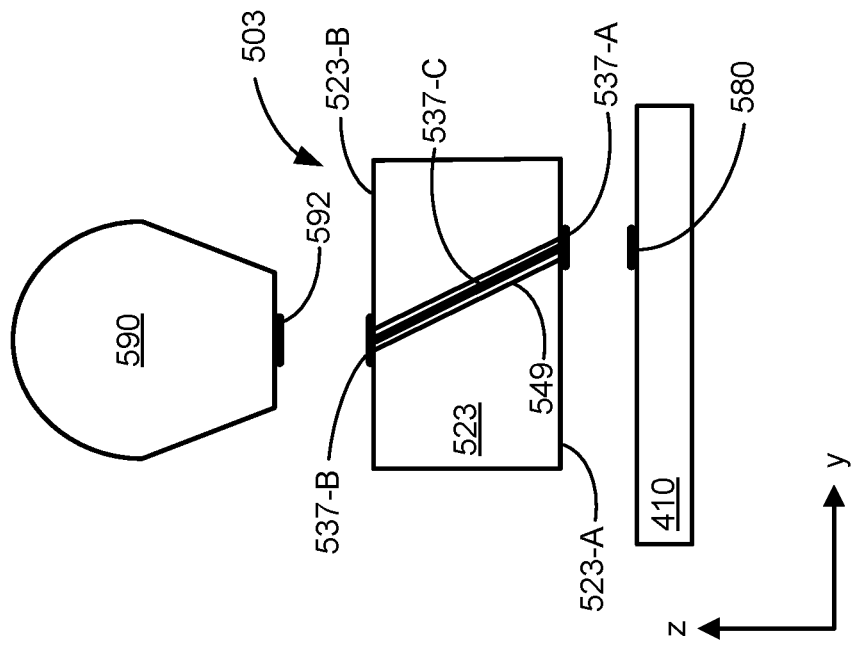

FIGS. 5W and 5X illustrate spacer 503 when surface mounted to PCB 410 and SMD 590 in accordance with some embodiments. SMD 590 is electrically coupled to and spaced apart from a surface of PCB 410 in the z-direction via spacer 503 in a similar manner as described above with respect to spacer 500. Spacer 503 is similar to spacer 501 in that it provides both a z-offset and a lateral offset (e.g., in one or more of the x and y directions) with respect to a mounting position on a PCB 410. However, unlike spacer 501 which has electrically non-conducting body 522 that includes through holes 524, electrically non-conducting body 523 of spacer 503 includes indents 549 on its sidewalls, similar to electrically non-conducting body 523 of spacer 502. As shown, a respective connecting member 537-C of a respective electrical conductor 537 is disposed in a respective indent 549, allowing SMD 590 to be electrically coupled to PCB 410.

Figure 6A:
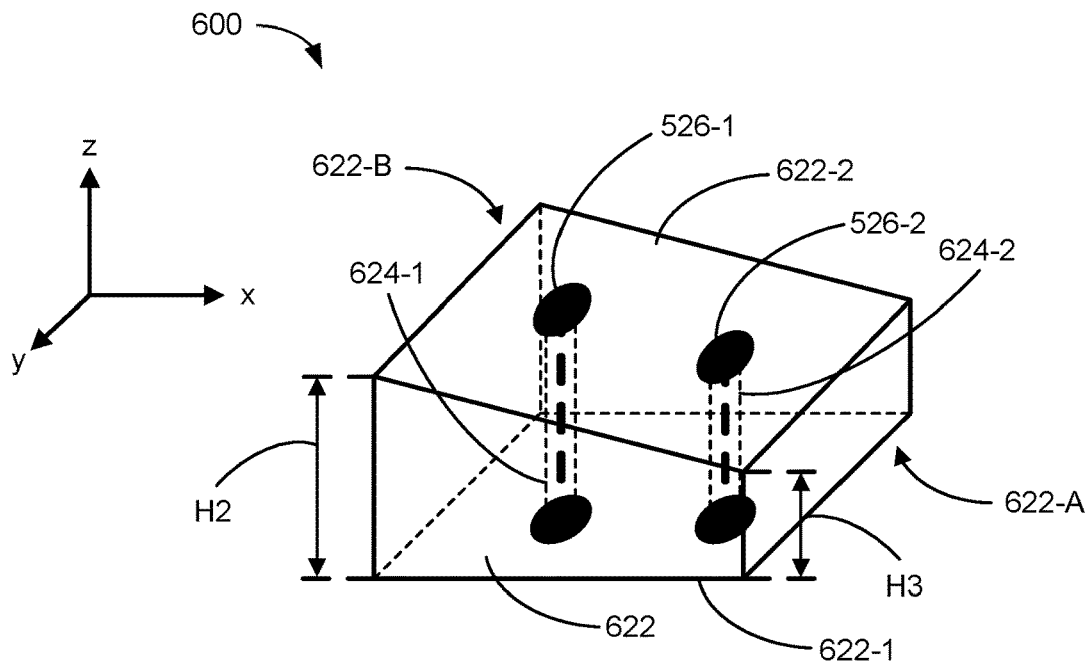
FIG. 6A illustrates a perspective view of a spacer in accordance with some embodiments.

FIG. 6A illustrates spacer 600 in accordance with some embodiments. Spacer 600 includes electrically non-conducting body 622 having a first side 622-A and an opposing second side 622-B. Spacer 600 also includes electrical conductors (e.g., electrical conductors 526, 536, or 537).

In some embodiments, electrically non-conducting body 622 has one or more through holes 624-1 and 624-2 (individually or collectively referred to hereafter as 624), corresponding to through holes 524 described above with respect to FIG. 5A. Alternatively, electrically non-conducting body 622 may include one or more indents (e.g., in place of or instead of through holes 548), corresponding to indents 548, described above with respect to FIG. 5L.

Figure 6B:
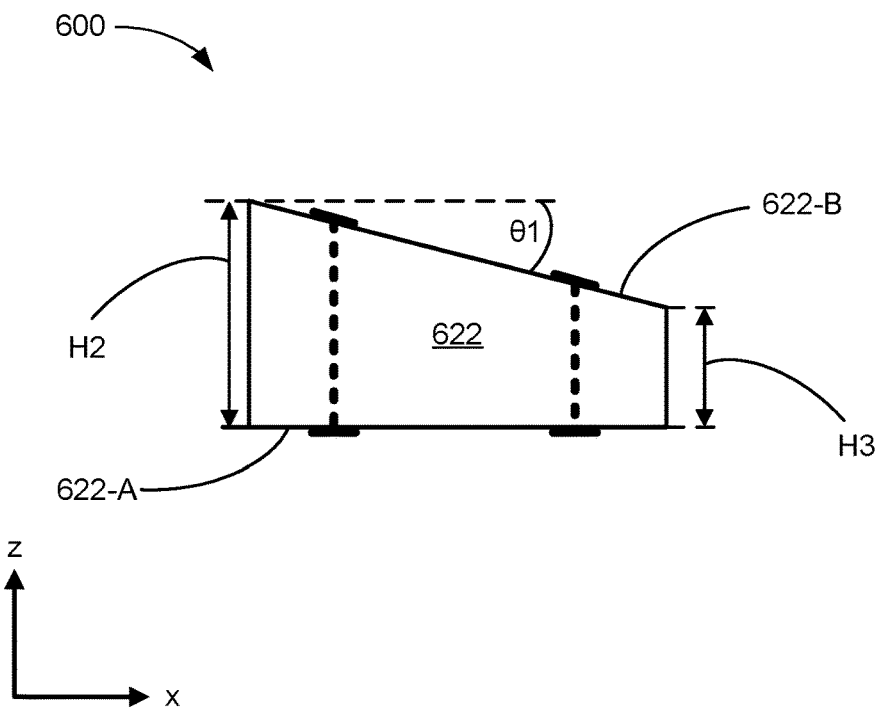
FIG. 6B illustrates a side view of the spacer shown in FIG. 6A.

In some embodiments, electrically non-conducting body 622 has a seventh surface 622-1 located on the first side 622-A of electrically non-conducting body 622 and an eighth surface 622-2 located on the second side 622-B of electrically non-conducting body 622. As shown in FIG. 6B, eighth surface 622-2 is slanted (e.g., forms angle θ1, 0 degrees >θ1>90 degrees) with respect to seventh surface 622-1 such that eighth surface 622-2 is non-parallel and non-perpendicular with respect to seventh surface 622-1. Thus, electrically non-conducting body 622 has a second height H2 and a third height H3, distinct from second height H2, allowing spacer 600 to provide a tilted orientation with respect to seventh surface 622-1. Accordingly, spacer 600 also provides an offset in the z-direction that is no smaller than second height H2 or third height H3, whichever is smaller.

Figure 6D:
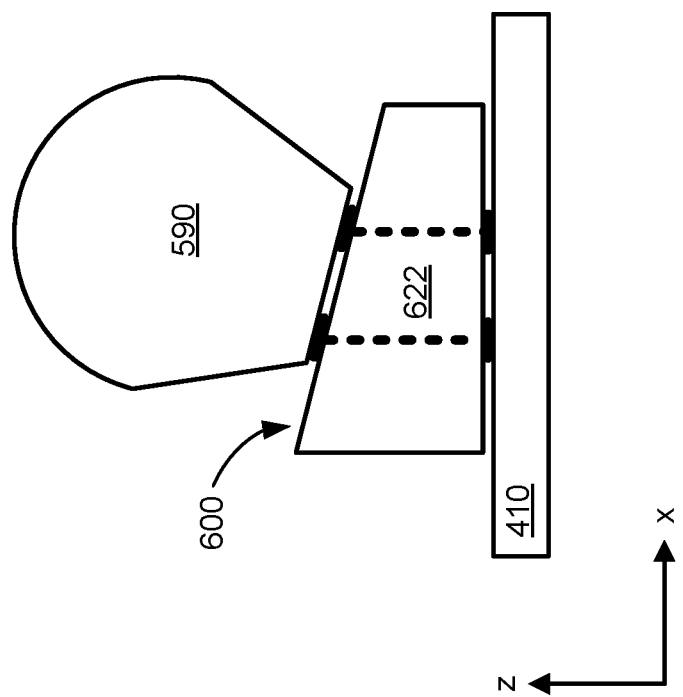
FIGS. 6C and 6D illustrate side views of an illumination element in accordance with some embodiments.
Figure 6C:
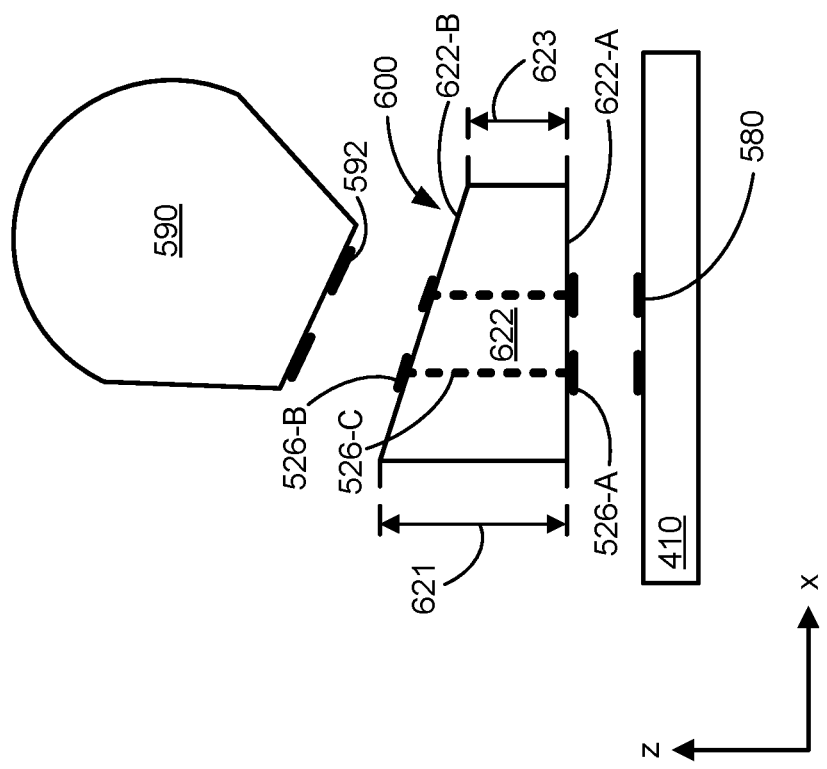

FIGS. 6C and 6D illustrate SMD 590 when surface mounted to PCB 410 via spacer 600 in accordance with some embodiments. SMD 590 is electrically coupled to and spaced apart from a surface of PCB 410 in the z-direction via spacer 600 in the same manner as described above with respect to spacer 500 in FIGS. 5Q and 5R. In addition to an offset in the z-direction, spacer 600 also provides a tilt in orientation with respect to the surface of PCB 410. Although spacer 600 is shown in FIGS. 6C and 6D to provide a tilt about the y-axis (therefore providing a tilt in the x-direction), spacer 600 can also be implemented to provide a tilt about the x-axis (e.g., providing a tilt in the y-direction). Additionally, spacer 600 can be implemented to provide an offset along one or more of the x-direction and y-direction in addition to providing a tilt and a z-offset. Thus, an SMD, when surface mounted onto a surface of a PCB via spacer 600, is spaced apart from and angled with respect to the surface of the PCB.

In some embodiments, a spacer may be configured to provide a tilted orientation with respect to seventh surface 622-1 about both the x and y axes (e.g., in both the y and x directions, respectively).

Figure 6E:
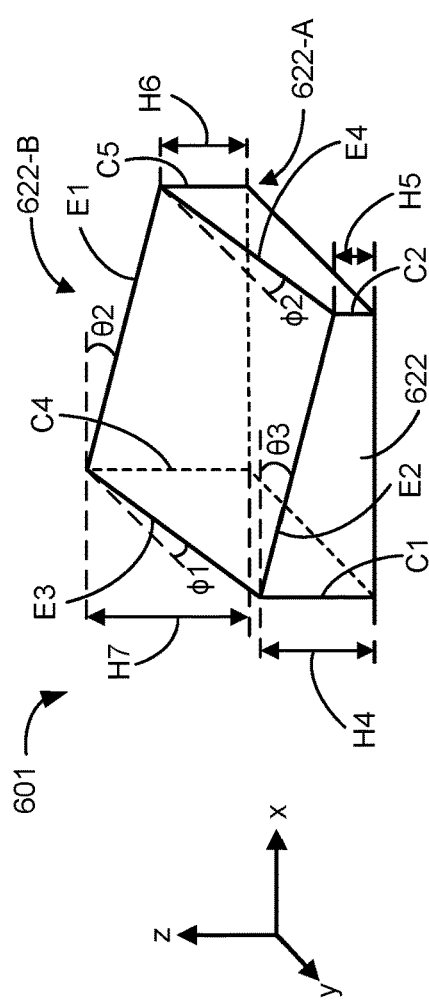
FIG. 6E illustrates a spacer in accordance with some embodiments.

FIG. 6E illustrates spacer 601 in accordance with some embodiments. Spacer 601 includes electrically non-conducting body 622, as described above with respect to FIG. 6A with the exception that in spacer 601, eighth surface 622-2 of electrically non-conducting body 622 is slanted with respect to seventh surface 622-1 of electrically non-conducting body 622 about both the x and y axes (e.g., two directions of tilt), providing a tilted orientation in both the y and x directions respectively. As shown, eighth surface 622-2 is non-parallel and non-perpendicular with respect to seventh surface 622-1, such that eighth surface 622-2 is tilted in the x-direction and the y-direction with respect to seventh surface 622-1. Due to the combination of the tilts in the x and y directions, a first edge E1 of eighth surface 622-2 forms an angle θ2 with respect to seventh surface 622-1 such that 0 degrees >θ2>90 degrees and a second edge E2 of eighth surface 622-2 forms an angle θ3 with respect to seventh surface 622-1 such that 0 degrees >θ3>90 degrees. A third edge E3 of eighth surface 622-2 also forms an angle φ1 with respect to seventh surface 622-1 such that 0 degrees >φ1>90 degrees and a fourth edge E4 of eighth surface 622-2 forms angle φ2 with respect to seventh surface 622-1 such that 0 degrees >φ2>90 degrees. Since eighth surface 622-2 is tilted in the x and y directions, angle θ3 is distinct from θ2 and angle φ2 is distinct from angle φ1. Thus, electrically non-conducting body 622 of spacer 601 has a first corner C1 with a fourth height H4, a second corner C2 with a fifth height H5, a third corner C5 with a sixth height H6, and a fourth corner C4 with a seventh height H7. Due to the tilt in both x and y directions, each of the fourth height H4, fifth height H5, sixth height H6, and seventh height H7 are distinct from one another. Accordingly, spacer 601 also provides an offset in the z-direction that is no smaller than at least one of the fourth height H4, the fifth height H5, the sixth height H6, or the seventh height H7, whichever is smaller. Thus, an SMD, when surface mounted to a surface of a PCB via spacer 600, is tilted with respect to the surface of the PCB by an angle along a first direction and a different angle along a second direction.

In some embodiments, spacer 601 is configured to provide an offset in the z direction as well as a tilt in one or more directions without providing a lateral offset along the x or y directions with respect to a mounting position on a PCB. In such cases, spacer 601 may include through holes 524 and/or indents 548 that are substantially perpendicular (e.g., forms an angle between 85 degrees to 95 degrees) to a surface of electrically non-conducting body 622 (similar to through holes 524 shown in FIG. 5A and indents 548 shown in FIG. 5L) in order to accommodate electrical conductor 526.

Figure 6G:
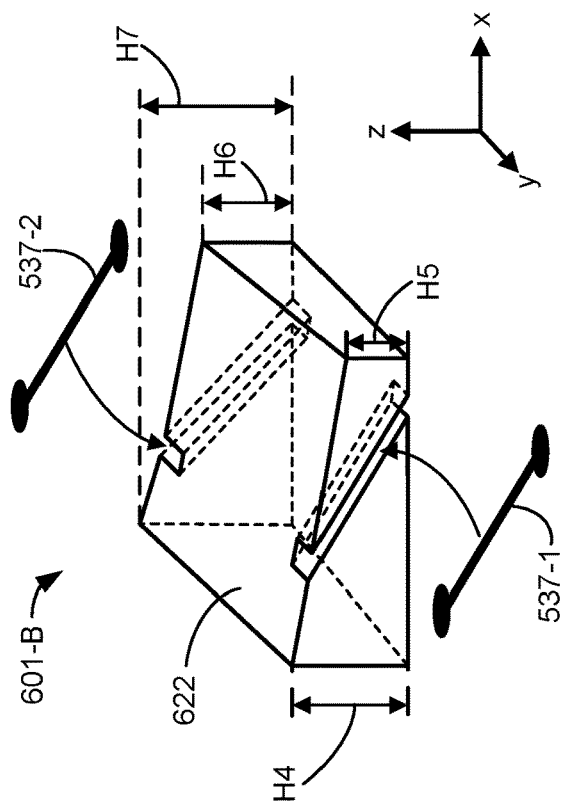
FIG. 6G illustrates a side view of an embodiment of the spacer shown in FIG. 6E.
Figure 6F:
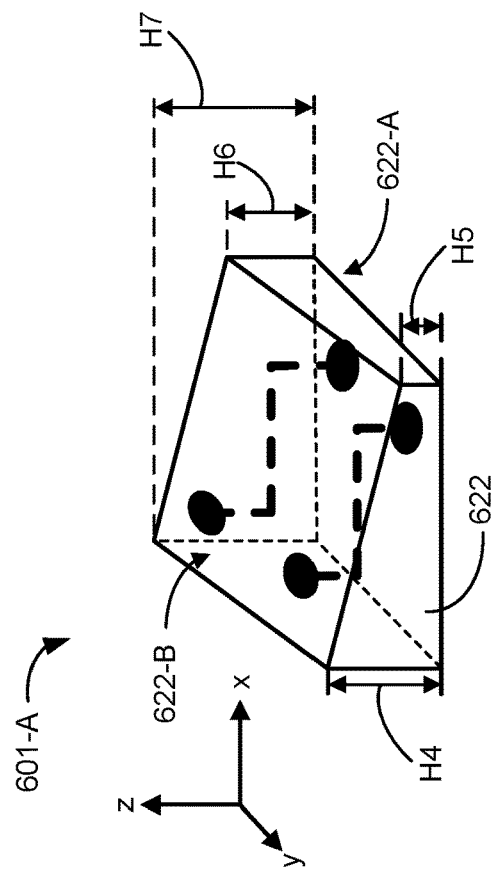
FIG. 6F illustrates a side view of an embodiment of the spacer shown in FIG. 6E.

Alternatively, a spacer may be configured to also provide a lateral offset along one or more of the x or y directions in addition to a tilt in orientation. FIGS. 6F and 6G illustrate spacers 601-A and 601-B, respectively. Spacers 601-A and 601-B are configured to provide a lateral offset, a z-offset, and a tilt in at least one direction in accordance with some embodiments. Referring to FIG. 6F, electrically non-conducting body 622 of spacer 601-A includes through holes 524 that can accommodate electrical conductors 536 and/or electrical conductor 537 in order to provide a lateral offset, as described above with respect to spacer 501 in FIGS. 5H-5I. Referring to FIG. 6G, electrically non-conducting body 622 of spacer 601-B includes indents 548 that can accommodate electrical conductors 536 and/or electrical conductor 537 in order to provide a lateral offset, as described above with respect to spacer 503 in FIGS. 5W and 5X. Thus, an SMD, when surface mounted to a surface of a PCB via spacer 601, 601-A, or 601-B, is tilted with respect to the surface of the PCB and offset with respect to a mounting position on the surface of the PCB along one or more of the x and y directions.

In light of these principles, we now turn to certain embodiments of surface mountable electronic components.

In accordance with some embodiments, a spacer (e.g., spacer 434, 500, 501, 502, 503 600, 601, 601-A, 601-B) that is mountable on a printed circuit board (e.g., PCB 410) has (e.g., forming one or more angles: α1, α2, θ1, θ2, θ3, φ1, φ2) an electrically non-conducting body (e.g., electrically non-conducting body 522, 523, 622) and electrical conductors (e.g., electrical conductors 526, 536, 537). The electrically non-conducting body has a first side (e.g., first side 522-A, 523-A, 622-A) and a second side (e.g., second side 522-B, 523-B, 622-B) that opposes the first side. The electrical conductors have a first member (e.g., first member 526-A, 536-A, 537-A) on the first side of the electrically non-conducting body, a second member (e.g., second member 526-B, 536-B, 537-B) on the second side of the electrically non-conducting body, and a connecting member (e.g., connecting member 526-C, 536-C, 537-C) joining the first member on the first side and the second member on the second side. The first member is configured to allow the spacer to be surface mounted on the printed circuit board. The second member is configured to allow an electrical component (e.g., SMD 432, 590) to be surface mounted on the second side of the electrically non-conducting body and electrically coupled to the printed circuit board via the electrical conductors.

In some embodiments, the electrically non-conducting body (e.g., electrically non-conducting body 522, 523, 622) has a first surface (e.g., first surface 522-1, third surface 522-3, fifth surface 523-5, seventh surface 622-1) on the first side (e.g., first side 522-A, 523-A, 622-A) and a second surface (e.g., second surface 522-2, fourth surface 523-4, sixth surface 523-6, eighth surface 622-2) on the second side (e.g., second side 522-B, 523-B, 622-B). The second surface is slanted with respect to the first surface (e.g., forming one or more angles: α1, α2, θ1, θ2, θ3, φ1, φ2). In some embodiments, the second surface is slanted with respect to the first surface about one or more of the x-axis, the y-axis, and the z-axis.

In some embodiments, the second surface (e.g., second surface 522-2, fourth surface 523-4, sixth surface 523-6, eighth surface 622-2) of the electrically non-conducting body (e.g., electrically non-conducting body 522, 523, 622) is slanted (e.g., forming one or more angles: α1, α2, θ1, θ2, θ3, φ1, φ2) with respect to the first surface (e.g., first surface 522-1, third surface 523-3, fifth surface 523-5, seventh surface 622-1) such that the electrical component (e.g., SMD 432, 590), when surface mounted on the second surface, is angled with respect to the printed circuit board (e.g., PCB 410).

In some embodiments, the electrically non-conducting body (e.g., electrically non-conducting body 522, 523, 622) has a first surface (e.g., first surface 522-1, third surface 523-3, fifth surface 523-5) on the first side (e.g., first side 522-A, 523-A, 622-A) and a second surface (e.g., second surface 522-2, fourth surface 523-4, sixth surface 523-6) on the second side (e.g., second side 522-B, 523-B, 622-B). The second surface is substantially parallel (e.g., forming an angle less than 1 degree) with respect to the first surface.

In some embodiments, the second surface (e.g., second surface 522-2, fourth surface 523-4, sixth surface 523-6, eighth surface 622-2) of the electrically non-conducting body (e.g., electrically non-conducting body 522, 523, 622) is spaced apart from the first surface (e.g., first surface 522-1, third surface 523-3, fifth surface 523-5, seventh surface 622-1) such that the electrical component (e.g., SMD 432, 590), when surface mounted on the second surface, is spaced apart from the printed circuit board (e.g., PCB 410).

In some embodiments, the electrical conductors (e.g., electrical conductor 526) include a first electrical conductor (e.g., first electrical conductor 526-1) and the connecting member (e.g., connecting member 526-C) of the first electrical conductor extends from the first side (e.g., first side 522-A, 622-A) to the second side (e.g., second side 522-B, 622-B) of the electrically non-conducting body in a direction that is substantially perpendicular (e.g., forms an angle between 85 degrees and 95 degrees) to a surface (e.g., first surface 522-1, third surface 522-3, fifth surface 523-5, seventh surface 622-1) of the electrically non-conducting body on the first side.

In some embodiments, the electrical conductors (e.g., electrical conductor 536) include a first electrical conductor (e.g., first electrical conductor 536-1) and at least a portion of the connecting member (e.g., connecting member 536-C) of the first electrical conductor extends from the first side (e.g., first side 522-A, 622-A) to the second side (e.g., second side 522-B, 622-B) of the electrically non-conducting body (e.g., electrically non-conducting body 522) in a direction that is substantially parallel (e.g., forms an angle less than 1 degree) to a surface (e.g., first surface 522-1, third surface 522-3, fifth surface 523-5, seventh surface 622-1) of the electrically non-conducting body on the first side.

In some embodiments, the electrical conductors (e.g., electrical conductor 537) include a first electrical conductor (e.g., first electrical conductor 537-1) and the connecting member (e.g., connecting member 537-C) of the first electrical conductor extends from the first side (e.g., first side 522-A, 622-A) to the second side (e.g., second side 522-B, 622-B) of the electrically non-conducting body (e.g., electrically non-conducting body 522) in a direction that forms an angle (e.g., forms an angle between 0 degrees and 90 degrees) to a surface (e.g., first surface 522-1, third surface 522-3, fifth surface 523-5, seventh surface 622-1) of the electrically non-conducting body on the first side. In some embodiments, the connecting member of the first electrical conductor is non-parallel and non-perpendicular with respect to a surface of the electrically non-conducting body.

In some embodiments, the electrically non-conducting body (e.g., electrically non-conducting body 522) has one or more holes (e.g., holes 524) between the first side (e.g., first side 522-A, 622-A) and the second side (e.g., second side 522-B, 622-B). At least one of the electrical conductors (e.g., electrical conductors 526, 536, 537) has its connecting member (e.g., connecting member 526-C, 536-C, 537-C) disposed in a respective hole, allowing the electrical conductor to extend from the first side to the second side of the electrically non-conducting body.

In some embodiments, the electrically non-conducting body (e.g., electrically non-conducting body 522) has one or more sidewalls (e.g., sidewalls 522-7, 522-8) that are substantially perpendicular (e.g., forms an angle between 85 degrees and 95 degrees) to a surface (e.g., fifth surface 523-5, seventh surface 622-1) of the electrically non-conducting body on the first side (e.g., first side 522-A, 622-A). At least one of the electrical conductors has its connecting member (e.g., connecting member 526-C, 536-C, 537-C) disposed in a respective indent (e.g., indents 548), allowing the electrical conductor to extend from the first side to the second side of the electrically non-conducting body.

In accordance with some embodiments, an electrical assembly (e.g., electrical assembly 401, 402) includes a printed circuit board (e.g., PCB 410), one or more spacers (e.g., spacer 434, 500, 501, 502, 600, 601) that are surface mounted on the printed circuit board, and one or more electrical components (e.g., SMD 432, 590). Each of the spacers include an electrically non-conducting body (e.g., electrically non-conducting body 522, 523, 622) and electrical conductors (e.g., electrical conductors 526, 536, 537). The electrically non-conducting body has a first side (e.g., first side 522-A, 523-A, 622-A) and a second side (e.g., second side 522-B, 523-B, 622-B) that opposes the first side. The electrical conductors have a first member (e.g., first member 526-A, 536-A, 537-A) on the first side of the electrically non-conducting body, a second member (e.g., second member 526-B, 536-B, 537-B) on the second side of the electrically non-conducting body, and a connecting member (e.g., connecting member 526-C, 536-C, 537-C) joining the first member on the first side and the second member on the second side. The first member is configured to allow the spacer to be surface mounted on the printed circuit board. The second member is configured to allow an electrical component to be surface mounted on the second side of the electrically non-conducting body and electrically coupled to the printed circuit board via the electrical conductors. Each electrical component of the one or more electrical components is surface mounted on the second side of an electrically non-conducting body of a respective spacer and is electrically coupled to the printed circuit board through electrical conductors of the respective spacer.

In accordance with some embodiments, a respective electrically non-conducting body (e.g., electrically non-conducting body 522, 523, 622) of a respective spacer (e.g., spacer 434, 500, 501, 502, 600, 601) of the one or more spacers has a first surface (e.g., first surface 522-1, third surface 523-3, fifth surface 523-5, seventh surface 622-1) on the first side (e.g., first side 522-A, 523-A, 622-A) and a second surface (e.g., second surface 522-2, fourth surface 523-4, sixth surface 523-6, eighth surface 622-2) on the second side (e.g., second side 522-B, 523-B, 622-B) that is opposite to and spaced apart from the first side. Each of the one or more electrical components is surface mounted on the second surface of a respective electrically non-conducting body.

In accordance with some embodiments, the second surface (e.g., second surface 522-2, fourth surface 523-4, sixth surface 523-6) is substantially parallel (e.g., forms an angle less than 1 degree) to the first surface (e.g., first surface 522-1, third surface 523-3, fifth surface 523-5) of the electrically non-conducting body (e.g., electrically non-conducting body 522, 523, 622).

In accordance with some embodiments, the second surface (e.g., second surface 522-2, fourth surface 523-4, sixth surface 523-6, eighth surface 622-2) is slanted (e.g., forming one or more angles: $\alpha 1, \alpha 2, \theta 1, \theta 2, \theta 3, \phi 1, \phi 2$) with respect to the first surface (e.g., first surface 522-1, third surface 523-3, fifth surface 523-5, seventh surface 622-1) of the electrically non-conducting body (e.g., electrically non-conducting body 522, 523, 622).

In accordance with some embodiments, the one or more spacers (e.g., spacer 434, 500, 501, 502, 600, 601) includes a plurality of spacers arranged around a circle (e.g., see eye-illumination assembly 402). A second surface (e.g., second surface 522-2, fourth surface 523-4, sixth surface 523-6, eighth surface 622-2) of a respective electrically non-conducting body (e.g., electrically non-conducting body 522, 523, 622) of each of the plurality of spacers is tilted toward a center of the circle.

In accordance with some embodiments, the electrical conductors (e.g., electrical conductors 526) include a first electrical conductor (e.g., first electrical conductor 526-1). The connecting member (e.g., connecting member 526-C) of the first electrical conductor extends from the first side (e.g., first side 522-A, 523-A, 622-A) to the second side (e.g., second side 522-B, 523-B, 622-B) of the electrically non-conducting body (e.g., electrically non-conducting body 522, 523, 622) in a direction that is substantially perpendicular (e.g., forms an angle between 85 degrees and 95 degrees) to the printed circuit board (e.g., PCB 410).

In accordance with some embodiments, the electrical conductors include (e.g., electrical conductor 536) a first electrical conductor (e.g., first electrical conductor 536-1). At least a portion of the connecting member (e.g., connecting member 536-C) of the first electrical conductor extends from the first side (e.g., first side 522-A, 523-A, 622-A) to the second side (e.g., second side 522-B, 523-B, 622-B) of the electrically non-conducting body (e.g., electrically non-conducting body 522, 523, 622) in a direction that is substantially parallel (e.g., forms an angle than 1 degree) to the printed circuit board (e.g., PCB 410).

In accordance with some embodiments, the electrical conductors (e.g., electrical conductor 537) include a first electrical conductor (e.g., first electrical conductor 537-1). The connecting member (e.g., connecting member 537-C) of the first electrical conductor extends from the first side (e.g., first side 522-A, 523-A, 622-A) to the second side (e.g., second side 522-B, 523-B, 622-B) of the electrically non-conducting body (e.g., electrically non-conducting body 522, 523, 622) in a direction that forms an angle (e.g., forms an angle between 0 degrees and 90 degrees) with respect to a surface of the printed circuit board (e.g., PCB 410). In some embodiments, the connecting member of the first electrical conductor extends from the first side to the second side of the electrically non-conducting body in a direction that forms an angle that is non-perpendicular and non-parallel with respect to a surface of the printed circuit board.

In accordance with some embodiments, the electrically non-conducting body (e.g., electrically non-conducting body 522, 523, 622) has one or more through holes (e.g., through holes 524) between the first side (e.g., first side 522-A, 523-A, 622-A) and the second side (e.g., second side 522-B, 523-B, 622-B). At least one of the electrical conductors (e.g., electrical conductors 526, 536, 537) has its connecting member (e.g., connecting member 526-C, 536-C, 537-C) located in a respective through hole allowing the electrical conductor to extend from the first side to the second side of the electrically non-conducting body.

In accordance with some embodiments, the electrically non-conducting body (e.g., electrically non-conducting body 522, 523, 622) includes one or more sidewalls (e.g., sidewalls 522-7, 522-8) perpendicular to the first side (e.g., first side 522-A, 523-A, 622-A) and the second side (e.g., second side 522-B, 523-B, 622-B). A sidewall of the one or more sidewalls has an indent (e.g., indents 548) that extends from the first side to the second side. At least one of the electrical conductors (e.g., electrical conductors 526, 536, 537) has its connecting member (e.g., connecting member 526-C, 536-C, 537-C) disposed in a respective indent allowing the electrical conductor to extend from the first to the second side of the electrically non-conducting body.

In accordance with some embodiments, the one or more electrical components (e.g., SMD 432, 590) include a first light-emitting electrical component (e.g., SMD 432-1) that is tilted with respect to the printed circuit board (e.g., PCB 410) by a first angle (e.g., first angle $\alpha 1$). The one or more electrical components also include a second light-emitting electrical component (e.g., SMD 432-2) that is tilted with respect to the printed circuit board by a second angle (e.g., second angle $\alpha 2$) that is distinct from the first angle.

Although various drawings illustrate operations of particular components or particular groups of components with respect to one eye, a person having ordinary skill in the art would understand that analogous operations can be performed with respect to the other eye or both eyes. For brevity, such details are not repeated herein.

Although some of various drawings illustrate a number of logical stages in a particular order, stages which are not order dependent may be reordered and other stages may be combined or broken out. While some reordering or other groupings are specifically mentioned, others will be apparent to those of ordinary skill in the art, so the ordering and groupings presented herein are not an exhaustive list of alternatives. Moreover, it should be recognized that the stages could be implemented in hardware, firmware, software or any combination thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A spacer, comprising:
an electrically non-conducting body having a first surface on a first side and a second surface on a second side opposing the first side, the second surface forming a first slanted angle with respect to the first surface; and
electrical conductors, each electrical conductor having a first member on the first side of the electrically non-conducting body, a second member on the second side of the electrically non-conducting body, and a connecting member joining the first member on the first side and the second member on the second side, wherein:
the electrically non-conducting body includes one or more sidewalls perpendicular to a surface of the electrically non-conducting body on the first side;
a sidewall of the one or more sidewalls has an indent that extends from the first side to the second side;
the indent forming a second angle, distinct from the first angle, with respect to the first surface such that the indent is non-perpendicular to the first surface; and
at least one of the electrical conductors has its connecting member disposed in a respective indent.

2. The spacer of claim 1, wherein the second surface of the electrical non-conducting body is spaced apart from the first surface.

3. The spacer of claim 1, wherein:
the electrical conductors include a first electrical conductor; and
the connecting member of the first electrical conductor extends from the first side to the second side in a direction that is perpendicular to a surface of the electrically non-conducting body on the first side.

4. The spacer of claim 1, wherein:
the electrical conductors include a first electrical conductor; and
at least a portion of the connecting member of the first electrical conductor extends in a direction that is parallel to a surface of the electrically non-conducting body on the first side.

5. The spacer of claim 1, wherein:
the electrical conductors include a first electrical conductor; and
the connecting member of the first electrical conductor extends from the first side to the second side in a direction that forms an angle with respect to a surface of the electrically non-conducting body on the first side.

6. An electrical assembly, comprising:
a printed circuit board;
one or more spacers surface mounted on the printed circuit board, each of the one or more spacers including:
an electrically non-conducting body having a first side, an opposing second side, and
electrical conductors, each electrical conductor having a first member on the first side, a second member on the second side, and a connecting member disposed in the electrically non-conducting body between the first side and the second side, the connecting member joining the first member on the first side and the second member on the second side, the first member being positioned to allow the spacer to be surface mounted on the printed circuit board, the second member being positioned to allow an electrical component to be surface mounted on the second side and electrically coupled to the printed circuit board via the electrical conductor; and one or more electrical components each surface mounted on the second side of a respective spacer of the one or more spacers and electrically coupled to the printed circuit board through the respective spacer, wherein:
  the one or more electrical components include a first light-emitting electrical component and a second light-emitting electrical component;
  the first light-emitting electrical component is tilted with respect to the printed circuit board by a first angle; and
  the second light-emitting electrical components is tilted with respect to the printed circuit board by a second angle that is distinct from the first angle.

7. The electrical assembly of claim 6, wherein a respective electrically non-conducting body of a respective spacer of the one or more spacers has a first surface on the first side and a second surface on the second side that is opposite to and spaced apart from the first side, and each of the one or more electrical components is surface mounted on the second surface.

8. The electrical assembly of claim 7, wherein the second surface is parallel to the first surface.

9. The electrical assembly of claim 7, wherein the second surface is tilted with respect to the first surface.

10. The electrical assembly of claim 9, wherein:
  the one or more spacers include a plurality of spacers arranged around a circle; and
  the second surface of each of the plurality of spacers is tilted toward a center of the circle.

11. The electrical assembly of claim 6, wherein:
  the electrical conductors include a first electrical conductor; and
  the connecting member of the first electrical conductor extends from the first side to the second side in a direction that is perpendicular to the printed circuit board.

12. The electrical assembly of claim 6, wherein:
  the electrical conductors include a first electrical conductor; and
  at least a portion of the connecting member of the first electrical conductor extends in a direction that is parallel to the printed circuit board.

13. The electrical assembly of claim 6, wherein:
  the electrical conductors include a first electrical conductor; and
  the connecting member of the first electrical conductor extends from the first side to the second side in a direction that forms an angle with respect to a surface of the printed circuit board.

14. The electrical assembly of claim 6, wherein:
  the electrically non-conducting body has one or more through holes between the first side and the second side; and
  at least one of the electrical conductors has its connecting member located in a respective through hole.

15. An electrical assembly, comprising:
  a printed circuit board;
  one or more spacers surface mounted on the printed circuit board, wherein at least one of the one or more spacers includes the spacer of claim 1; and
  one or more electrical components each surface mounted on the second side of a respective spacer of the one or more spacers and electrically coupled to the printed circuit board through the respective spacer.

16. An electrical assembly, comprising:
  a printed circuit board;
  a plurality of spacers surface mounted on the printed circuit board, the plurality of spacers including a first spacer and a second spacer, each of the first spacer and the second spacer including:
  an electrically non-conducting body having a first surface on a first side and a second surface on a second side opposing the first side, and
  electrical conductors, each electrical conductor having a first member on the first side, a second member on the second side, and a connecting member disposed in the electrically non-conducting body between the first side and the second side, the connecting member joining the first member on the first side and the second member on the second side, the first member being positioned to allow the spacer to be surface mounted on the printed cirucit board, the second member bein positioned to allow an electrical component to be surface mounted on the second side and electrically coupled to the printed circuit board via the electrical conductor, wherein:
  the first surface of the first spacer forms a first angle with respect to the second surface of the first spacer; and
  the first surface of the second spacer forms a second angle, distinct from the first angle, with respect to the second surface of the second spacer.

17. The electrical assembly of claim 16, wherein:
  the electrically non-conducting body has one or more through holes between the first side and the second side; and
  at least one of the electrical conductors has its connecting member disposed in a respective through hole.

18. The electrical assembly of claim 17, wherein:
  the respective through hole has a first opening that is disposed at a first lateral position on the first side of the electrically non-conducting body; and
  the first through hole has a second opening that is disposed at a second lateral position on the second side of the electrically non-conducting body that is offset from the first lateral position on the first side of the electrically non-conducting body.

\* \* \* \* \*